US010693072B2

United States Patent
Rhodes et al.

(10) Patent No.: US 10,693,072 B2
(45) Date of Patent: Jun. 23, 2020

(54) DIAZIRINE CONTAINING ORGANIC ELECTRONIC COMPOSITIONS AND DEVICE THEREOF

(71) Applicants: PROMERUS, LLC, Brecksville, OH (US); MERCK PATENT GMBH, Darmstadt (DE)

(72) Inventors: Larry F Rhodes, Brecksville, OH (US); Hugh Burgoon, Brecksville, OH (US); Irina Afonina, Southampton (GB); Tomas Backlund, Darmstadt (DE); Aurelie Morley, Winchester (GB)

(73) Assignees: PROMERUS, LLC, Brecksville, OH (US); MERCK PATENT GMBH, Darmstadt (DE)

( * ) Notice: Subject to any disclaimer, the term of this patent is extended or adjusted under 35 U.S.C. 154(b) by 15 days.

(21) Appl. No.: 16/257,128

(22) Filed: Jan. 25, 2019

(65) Prior Publication Data
US 2019/0157558 A1 May 23, 2019

Related U.S. Application Data

(63) Continuation of application No. 15/465,758, filed on Mar. 22, 2017, now Pat. No. 10,256,409.

(60) Provisional application No. 62/311,598, filed on Mar. 22, 2016.

(51) Int. Cl.
| | | |
|---|---|---|
| *H01L 51/00* | (2006.01) | |
| *C08F 132/08* | (2006.01) | |
| *H01L 51/05* | (2006.01) | |

(52) U.S. Cl.
CPC .......... *H01L 51/004* (2013.01); *C08F 132/08* (2013.01); *H01L 51/0067* (2013.01); *H01L 51/0021* (2013.01); *H01L 51/052* (2013.01); *H01L 51/0541* (2013.01); *H01L 51/0545* (2013.01); *Y02E 10/549* (2013.01); *Y02P 70/521* (2015.11)

(58) Field of Classification Search
CPC .............. H01L 51/004; H01L 51/0067; H01L 51/0021; H01L 51/052; H01L 51/0541; H01L 51/0545; C08F 132/08; Y02E 10/549

See application file for complete search history.

(56) References Cited

U.S. PATENT DOCUMENTS

| | | |
|---|---|---|
| 2006/0020068 A1 | 1/2006 | Elce et al. |
| 2012/0056183 A1 | 3/2012 | Mueller et al. |
| 2014/0049823 A1 | 2/2014 | Grubbs et al. |

FOREIGN PATENT DOCUMENTS

| | | |
|---|---|---|
| WO | WO2015/135622 A1 | 9/2015 |
| WO | WO2016/049123 A1 | 3/2016 |

OTHER PUBLICATIONS

Hakim Mehenni, A., et al., "Synthesis and Application of New Photocrosslinkers for Poly(ethylene glycol)," Aust. J. Chem., 2012, 65, 193-201.

*Primary Examiner* — Victor A Mandala
*Assistant Examiner* — Colleen E Snow
(74) *Attorney, Agent, or Firm* — Balaram Gupta

(57) ABSTRACT

The present invention relates to organic electronic devices, and more specifically to organic field effect transistors, comprising a dielectric layer that comprises a polycycloolefinic polymer and a diazirine compound.

20 Claims, 8 Drawing Sheets lisicon®SP400 and pHexylNB, 50 µm (TG)

lisicon®SP400 and pHexylNB with 10 phr BDA, 1.95 J/cm$^2$, 50 µm (TG)

lisicon®SP400 and pHexylNB with 30 phr BDA, 1.95 J/cm², 50 μm (TG)

typical performance with lisicon®SP400 and pDecylNB from a device set, 50 μm (TG)

lisicon®SP400 and pDecylNB with 10 phr BDA, 1.95 J/cm², 50 μm (TG)

lisicon®SP400 and Zeonex 480, no BDA, no UV, 50 μm (TG)

lisicon®SP400 and Zeonex 480 with 10 phr BDA, 1.95 J/cm², 50 μm (TG)

lisicon®SP400 and Topas 6013S-04, no BDA, no UV, 50 μm (TG)

Iisicon®SP400 and Topas 6013S-04 with 10 phr BDA, 1.95 J/cm², 50 μm (TG)

pDITT-TT and pBuDMMINB, 20 μm channel (BG)

pDITT-TT and pHexylNB and 10 phr BDA, 1.95 J/cm², 20 μm channel (BG)

lisicon®SP500 and pBuDMMINB, 20 μm channel (BG)

lisicon®SP500 and 10 phr BDA, 1.95 J/cm², 20 μm channel (BG)

DIAZIRINE CONTAINING ORGANIC ELECTRONIC COMPOSITIONS AND DEVICE THEREOF

CROSS REFERENCE TO RELATED APPLICATIONS

This application is a continuation of U.S. application Ser. No. 15/465,758, filed Mar. 22, 2017, now allowed, which claims the benefit of U. S. Provisional Application No. 62/311,598, filed Mar. 22, 2016, which is incorporated herein by reference in its entirety.

BACKGROUND OF THE INVENTION

Field of the Invention

The present invention relates to organic electronic compositions and devices thereof, specifically to organic dielectric compositions, and organic field effect transistors, comprising a dielectric layer that comprises a polycycloolefinic polymer and a diazirine compound.

Description of the Art

In recent years there has been growing interest in organic electronic (OE) devices, for example organic field effect transistors (OFET) for use in backplanes of display devices or logic capable circuits, and organic photovoltaic (OPV) devices. A conventional OFET has a gate electrode, a gate insulator layer made of a dielectric material (also referred to as "dielectric" or "gate dielectric"), source and drain electrodes, a semiconducting layer made of an organic semiconductor (OSC) material, and typically a passivation layer on top of the aforementioned layers to provide protection against environmental influence or against damage from subsequent device manufacturing steps.

For many top gate (TG) OFET applications fluorodielectrics like Cytop® or Hyflon® polymers are usually deposited from fluorosolvents, to provide a dielectric layer with inherent low permittivity ("low-k") and good orthogonality to a number of OSC material classes. However, the use of such dielectrics has a number of drawbacks, with the main issue being lack of cross-linking functionality which is difficult to incorporate without modifying the permittivity. In addition, the use of fluorinated solvents is not preferred for environmental and cost reasons.

It is desirable and advantageous to incorporate a reactive functionality into a dielectric which enables photo-patterning, as not only does this provide orthogonality to solvents employed in subsequent processing steps, but also allows for stack integration by the formation of via interconnects to the source and drain electrodes (S/D) below the dielectric and OSC layers, using photolithographic processes.

In developing a crosslinkable top gate dielectric, the bulk properties of the material used, such as low k and solubility must be retained. It is also important to consider the functional group employed in the cross-linking reaction to ensure quantities of polar or charged by-product species are not generated as side products. Such species will become incorporated into the cross-linked dielectric, causing unwanted effects such as an increase in the k value, or the introduction of charged species may dope the OSC layer resulting in decreased performance and stability.

Thus there is a need for solution processable dielectrics for the preparation of dielectric layers in OE devices, which have low permittivity, show good orthogonality to a number of OSC material classes, can be deposited from non-halogenated solvents, can be cross-linked to enable photo-patterning and stack integration by the formation of via interconnects to the S/D electrodes, and wherein the cross-linking reaction does not generate undesired polar or charged by-product species as side products.

In particular, it is desired to have a UV crosslinkable dielectric with a solubility profile orthogonal to the OSC polymer, a permittivity as low as possible to give the highest TFT performance, and a cross-linking functional group, and/or cross-linking agents, incorporated to allow via interconnect patterning. The dielectric should, in conjunction with the OSC polymer, give high mobility, high on currents, and low off currents.

The present invention enables satisfying the above needs by using a composition that encompasses a polycycloolefinic polymer in the dielectric layer of an OE device which does not contain a polar unit, is chemically inert, has an inherently low k, may have a pendant group or amorphous characteristics that imparts solubility and cross-linking functionality, and a cross-linking agent having a diazirine moiety.

SUMMARY OF THE INVENTION

The present invention relates to an OE device comprising a dielectric layer, said dielectric layer comprising, or being obtained through the use of, a composition comprising an amorphous polycycloolefinic polymer selected from the group consisting of:

a) a polymer having one or more distinct repeat units of formula (IA), where the repeat units are derived from a monomer of formula (I):

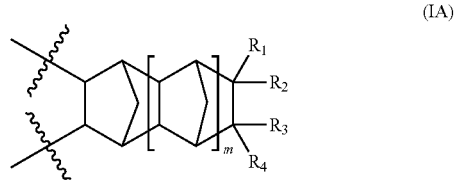

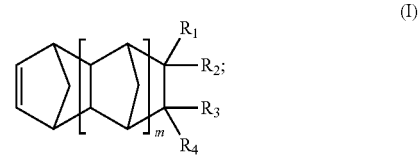

b) a random copolymer having repeat units of formula (IA) and another olefin having the formula (II):

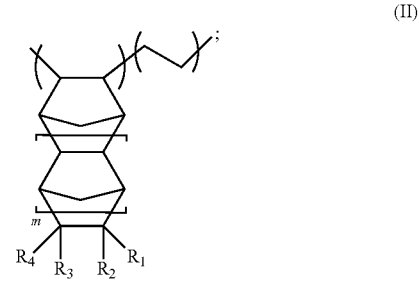

c) a polymer of formula (III):

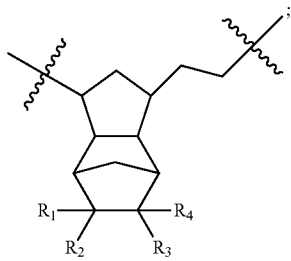
(III)

d) a polymer of formula (IV):

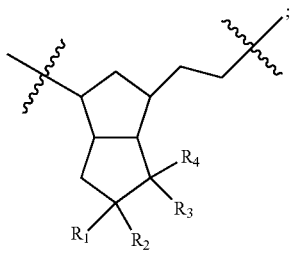
(IV)

wherein m is an integer 0, 1 or 2;

each occurrence of $R_1$, $R_2$, $R_3$ or $R_4$ may be same or different and each independently is hydrogen or a hydrocarbyl selected from the group consisting of linear or branched $(C_1-C_{12})$alkyl, $(C_3-C_{12})$cycloalkyl, $(C_3-C_{12})$cycloalkyl$(C_1-C_{12})$alkyl, $(C_6-C_{12})$bicycloalkyl, $(C_6-C_{12})$bicycloalkyl$(C_1-C_{12})$alkyl, $(C_7-C_{14})$tricycloalkyl, $(C_7-C_{14})$tricycloalkyl$(C_1-C_{12})$alkyl, $(C_6-C_{10})$aryl and $(C_6-C_{10})$aryl$(C_1-C_6)$alkyl; and a diazirine compound of formula (V):

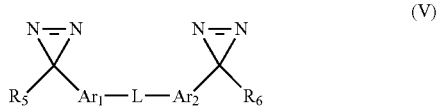
(V)

wherein,

L is a divalent linking or a spacer group selected from: —C(O)O—$R_7$—OC(O)—, —C(O)O—$R_7$—, —$R_7$—OC(O)—$R_7$—, —C(O)—$R_7$—OC(O)—, —C(O)—$R_7$—, —$R_7$—C(O)—$R_7$—, —O—$R_7$—OC(O)—, —O—$R_7$—O—, —O—$R_7$—, —$R_7$—O—$R_7$—, —C(O)NH—$(CH_2)_b$—NH(CO)—, where b is 1 to 15, —C(O)NH—$(CH_2CH_2O)_c(CH_2)_d$—$NR_5$(CO)—, where c is 2 to 6 and d is 1 to 6, and each occurrence of $R_7$ may be the same or different which is a divalent group independently selected from $(C_1-C_{12})$alkyl, $(C_3-C_{12})$cycloalkyl, $(C_6-C_{12})$aryl, $(C_6-C_{12})$aryl$(C_1-C_{12})$alkyl, $(C_6-C_{10})$heteroaryl, $(C_6-C_{10})$heteroaryl$(C_1-C_{12})$alkyl, —$(CH_2—CH_2—O)_a$—, where a is an integer from 1 to 10;

$R_5$ and $R_6$ are the same or different and each is independently selected from $(C_1-C_{12})$alkyl, where portions of hydrogen on alkyl are replaced with fluorine, $(C_1-C_{12})$perfluoroalkyl, $(C_6-C_{12})$aryl, $(C_6-C_{12})$aryl$(C_1-C_{12})$alkyl, where portions of hydrogen on alkyl are replaced with fluorine, and $(C_6-C_{12})$arylperfluoro$(C_1-C_{12})$alkyl; and $Ar_1$, $Ar_2$ and $Ar_3$ are the same or different and each is independently selected from $(C_6-C_{12})$arylene or $(C_6-C_{12})$heteroarylene group optionally substituted with a group selected from halogen, —OH, $(C_1-C_4)$alkyl, $(C_1-C_4)$alkoxy, $(C_6-C_{10})$aryl, $(C_6-C_{12})$aryloxy, $(C_6-C_{12})$aryl$(C_1-C_4)$alkyl and $(C_6-C_{12})$aryl$(C_1-C_4)$alkyloxy.

The invention further relates to a dielectric layer in an OE device, said dielectric layer comprising, or being obtained through the use of, a polycycloolefinic polymer of formulae (I), (II), (III) or (IV) as described above in combination with a diazirine compound of formula (V) as described above.

Some embodiments in accordance with the present invention encompass a process of preparing a dielectric layer in an OE device through the use of a polycycloolefinic polymer of formulae (I), (II), (III) or (IV) as described herein.

The aforementioned OE devices are, for example, Organic Field Effect Transistors (OFET), including Organic Thin Film Transistors (OTFT), Organic Light Emitting Diodes (OLED), Organic Photodetectors (OPD) or Organic Photovoltaic (OPV) devices. With regard to OFETs, such devices are inclusive of both top gate and bottom gate OFETs.

Embodiments of the present invention are also inclusive of products or assemblies encompassing an OE device as described above and below. Such products or assemblies being Integrated Circuits (IC), Radio Frequency Identification (RFID) tags, security markings or security devices containing an RFID tag, Flat Panel Displays (FPD), backplanes of FPDs, backlights of FPDs, electrophotographic devices, electrophotographic recording devices, organic memory devices, pressure sensors, optical sensors, chemical sensors, biosensors or biochips.

BRIEF DESCRIPTION OF THE DRAWINGS

Embodiments of the invention are described below with reference to the following drawings.

DETAILED DESCRIPTION OF THE INVENTION

Figure 1:
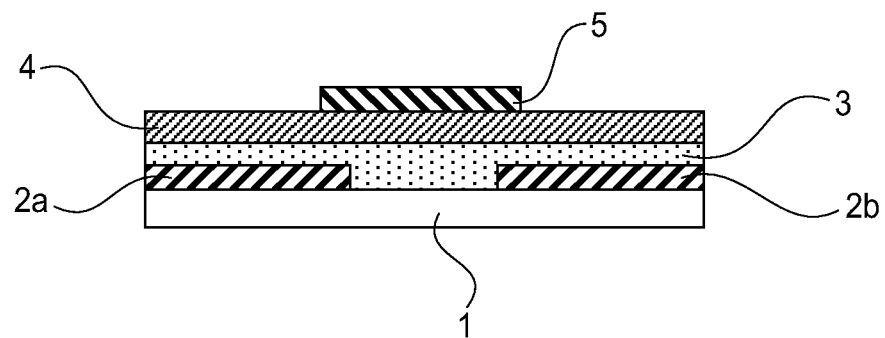
FIG. 1 is a schematic representation of a top gate OFET device embodiment in accordance with the present invention.

As used herein, the term Organic Field Effect Transistors (OFET) will be understood to be inclusive of the subclass of such devices known as Organic Thin Film Transistors (OTFTs).

In addition, it will be understood that the terms "dielectric" and "insulating" are used interchangeably herein. Thus reference to an insulating material or layer is inclusive of a dielectric material or layer. Further, as used herein, the term "organic electronic device" will be understood to be inclusive of the term "organic semiconductor device" and the several specific implementations of such devices, such as the OFETs, are as defined above.

As used herein, the terms "orthogonal" and "orthogonality" will be understood to mean chemical orthogonality. For example, an orthogonal solvent means a solvent which, when used in the deposition of a layer of a material dissolved therein on a previously deposited layer, does not dissolve said previously deposited layer.

As used herein, the term "polymer" will be understood to mean a molecule that encompasses a backbone of one or more distinct types of repeating units (the smallest constitutional unit of the molecule) and is inclusive of the commonly known terms "oligomer", "copolymer", "homopolymer" and the like. Further, it will be understood that the term polymer is inclusive of, in addition to the polymer itself, small amounts of residues from initiators, catalysts and other elements attendant to the synthesis of such a polymer, where such residues are understood as not being covalently incorporated thereto. Further, while such residues, and other elements, are generally removed during post polymerization purification processes, trace amounts of such materials can be found to be mixed or co-mingled with the polymer such that they generally remain with the polymer when it is transferred between vessels or between solvents or dispersion media.

As used herein, the term "small molecule" will be understood to mean a monomeric compound which typically does not carry a reactive group by which it can be reacted to form a polymer, and which is designated to be used in monomeric form. In contrast thereto, the term "monomer", unless stated otherwise, will be understood to mean a monomeric compound that carries one or more reactive functional groups by which it can be reacted to form an oligomer or a polymer.

As used herein, the term "organic semiconductor (OSC) composition", also shortly referred to as "composition", means at least one organic semiconductor (OSC) compound and one or more other materials added to the at least one OSC compound to provide, or to modify, specific properties of the OSC composition and/or of the at least one OSC compound therein. It will be understood that an OSC composition is also a vehicle for carrying the OSC to a substrate to enable the forming of layers or structures thereon. Exemplary materials include, but are not limited to, solvents, volatile surfactants and adhesion promoters.

As defined herein, the terms "polycycloolefin", "polycyclic olefin", and "norbornene-type" are used interchangeably and refer either to addition polymers or ring opening metathesis (ROMP) polymers, monomers or the resulting repeating unit, encompassing at least one norbornene moiety such as shown by either Structure (A1), (A2), (A3) or (A4) below. The simplest norbornene-type or polycyclic olefin monomer bicyclo[2.2.1]hept-2-ene (A1) is commonly referred to as norbornene. When norbornene is polymerized under addition polymerization conditions, the resulting repeat unit is of Structure (A1). When norbornene is polymerized under ROMP conditions, the resulting repeat unit is of Structure (A3), which is hydrogenated to Structure (A4).

(A1)

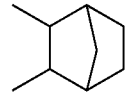
(A2)

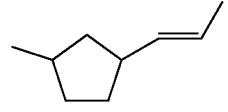
(A3)

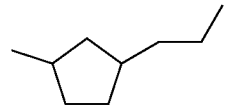
(A4)

However, the term "norbornene-type repeating unit" or "norbornene-type monomer", as used herein, is understood to not only mean norbornene itself but also to refer to any substituted norbornene, or substituted and unsubstituted higher cyclic derivatives thereof, for example of Structures (B1), (B2), (B3) or (B4) respectively shown below, wherein m is an integer of zero or greater, as defined herein, where m=zero being the norbornene monomer of formula A1 or its respective repeat unit of formula A2 (for example addition polymer) or A3 or A4 (for example ROMP polymer).

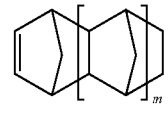
(B1)

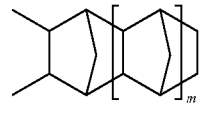
(B2)

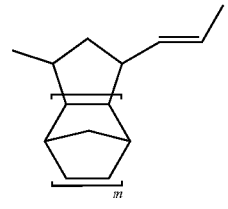
(B3)

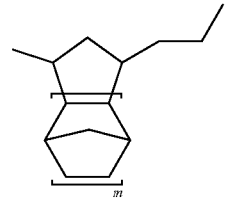
(B4)

As will be discussed hereinafter, the use of a substituted norbornene-type monomer to form polymer embodiments of the present invention allows for the properties of such embodiments to be tailored to fulfill the needs of individual applications. The procedures and methods that have been developed to polymerize norbornene-type monomers having a variety of functional substituents, such as those described below, exhibit an outstanding flexibility and tolerance to various moieties and groups of the monomers. In addition to polymerization of monomers with a specific pendant group, monomers having a variety of distinct functionalities can be randomly polymerized to form a final material where the types and ratios of monomers used dictate the overall bulk properties of the resulting polymer.

Some preferred embodiments of the present invention encompass an OE device comprising a dielectric layer, said dielectric layer essentially consisting of a polycycloolefinic polymer of formulae (I), (II), (III) or (IV) as described herein.

Accordingly, in some embodiments the present invention encompass an OE device comprising a dielectric layer, said dielectric layer essentially consisting of a polycycloolefinic polymer comprising one or more distinct repeat units derived from a norbornene type monomer of formula (I), which are formed by addition polymerization techniques. Such addition polycyclic olefin polymers are well known in the literature, see for example, International Patent Publication No. WO2015/135622 A1.

In some other embodiments the present invention encompass an OE device comprising a dielectric layer, said dielectric layer essentially consisting of a polycycloolefinic copolymer comprising one or more repeat units derived from a norbornene type monomer and another repeat unit derived from an olefin, such as for example ethylene. Such cyclic olefin copolymers derived from norbornene are commercially available under the tradename Topas® and are represented herein above as polymers of formula (II), see generally U.S. Pat. No. 6,214,951 B1.

In yet some other embodiments the present invention encompass an OE device comprising a dielectric layer, said dielectric layer essentially consisting of a polycycloolefinic polymer comprising one or more repeat units derived from a norbornene type monomer, which is polymerized under the conditions of ring opening metathesis polymerization (ROMP) and subsequently hydrogenated to obtain a polymer of formula (III) as described herein. Such cyclic olefin copolymers derived from norbornene are commercially available under the tradename Zeonex®, see generally U.S. Pat. No. 7,037,993 B2.

In yet some other embodiments the present invention encompass an OE device comprising a dielectric layer, said dielectric layer essentially consisting of a polycycloolefinic polymer comprising one or more repeat units derived from a monomer, such as for example dicyclopentadiene, which is polymerized under the conditions of ring opening metathesis polymerization (ROMP) and subsequently hydrogenated to obtain a polymer of formula (IV) as described herein. Such cyclic olefin copolymers derived from norbornene are commercially available under the tradename Zeonor®, see generally U.S. Pat. No. 6,310,160 B1.

Further preferred embodiments of the present invention encompass any one of the polycycloolefinic polymer of formulae (I) to (IV) that is used for preparing a dielectric layer in an OE device. Any of the active groups in this polymeric chain, including the pendant groups, such as for example, alkyl or olefinic group can be cross-linked in a cross-linking reaction, preferably initiated by a cross-linking agent, like for example a bis-diazirine cross-linker of formula (V) that initiates the reaction.

In some preferred embodiments of the present invention the polycycloolefinic polymer is soluble in non-fluorinated solvents, preferably in inert solvents, and is deposited from a solution in an inert, non-fluorinated solvent or solvent composition. The solvent or solvent composition provides good orthogonality to an underlying OSC layer and renders the polycycloolefinic polymer especially suitable for use as dielectric layer in a top gate OFET device.

The polycycloolefinic polymer, which is used in the dielectric layer, is preferably selected from norbornene-type polymers.

In some preferred polymer embodiments in accordance with the invention, the norbornene-type polymers incorporate two or more distinct types of repeating units.

Other preferred polymer embodiments in accordance with the invention encompass one or more norbornene-type polymers having one or more distinct types of repeating units of Formula IB

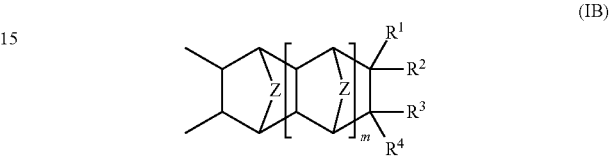

(IB)

wherein Z is selected from —CH$_2$—, —CH$_2$—CH$_2$— or —O—, m is an integer from 0 to 5, each of R$^1$, R$^2$, R$^3$ and R$^4$ independently denote H or a C$_3$ to C$_{20}$ alkenyl group, and wherein one or more of R$^{1-4}$ denote a C$_3$ to C$_{20}$ alkenyl group.

The repeating units of Formula IB are formed from the corresponding norbornene-type monomers of Formula IC where Z, m and R$^{1-4}$ are as defined above:

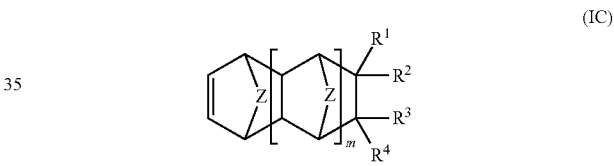

(IC)

Some preferred polymer embodiments in accordance with the present invention encompass repeating units of Formula IA derived from monomers of Formula I, where m is 0, 1 or 2. For other such embodiments m is 0 or 1, and for still other embodiments m is 0.

Other preferred polymer embodiments of the present invention encompass repeating units of Formula IA derived from monomers of Formula I where only one of R$_{1-4}$, for example R$_1$, is different from H, and the others of R$_{1-4}$ are H and m is 0.

In yet some other preferred polymer embodiments of the present invention encompass polymers of Formula II where only one of R$_{1-4}$, for example R$_1$, is different from H, and the others of R$_{1-4}$ are H and m is 0.

In yet some other preferred polymer embodiments of the present invention encompass polymers of Formula III where only one of R$_{1-4}$, for example R$_1$, is different from H, and the others of R$_{1-4}$ are H.

In yet some other preferred polymer embodiments of the present invention encompass polymers of Formula IV where only one of R$_{1-4}$, for example R$_1$, is different from H, and the others of R$_{1-4}$ are H.

In some other embodiments of this invention any of the diazirine compound of formula (V) can be used as a cross-linking agent. Exemplary diazirines within the scope of the invention may be enumerated as follows:

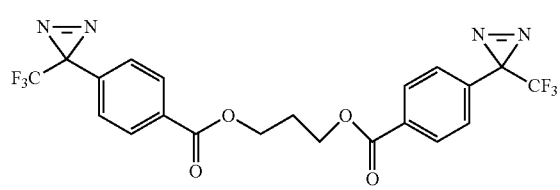 [SMILES: O=C(OCCCOC(=O)c1ccc(C2(C(F)(F)F)N=N2)cc1)c1ccc(C2(C(F)(F)F)N=N2)cc1]

propane-1,3-diyl bis(4-(3-(trifluoromethyl)-3H-diazirin-3-yl)benzoate);

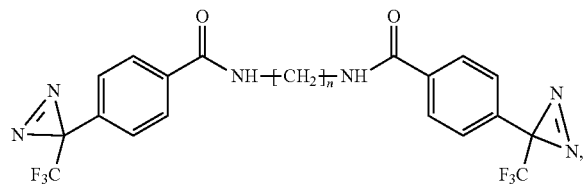

where n is 7 or 12;

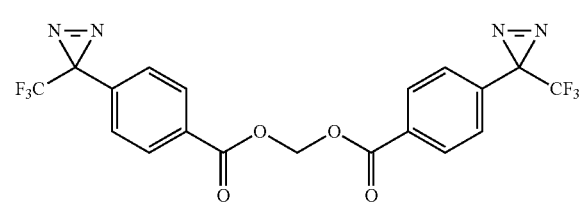

where n is 3 or 5;

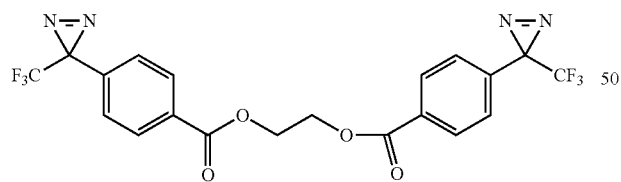

methylene bis(4-(3-(trifluoromethyl)-3H-diazirin-3-yl)benzoate);

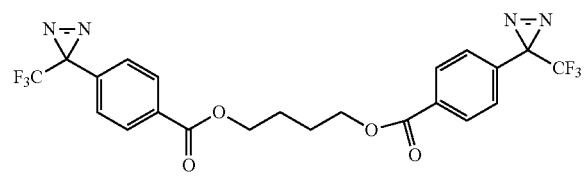 [SMILES: O=C(OCCCCOC(=O)c1ccc(C2(C(F)(F)F)N=N2)cc1)c1ccc(C2(C(F)(F)F)N=N2)cc1]

ethane-1,2-diyl bis(4-(3-(trifluoromethyl)-3H-diazirin-3-yl)benzoate);

butane-1,4-diyl bis(4-(3-(trifluoromethyl)-3H-diazirin-3-yl)benzoate);

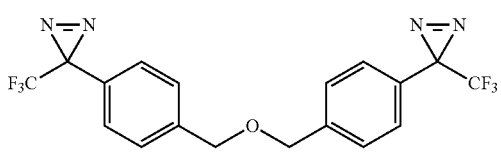 [SMILES: FC(F)(F)C1(c2ccc(COCc3ccc(C4(C(F)(F)F)N=N4)cc3)cc2)N=N1]

3,3'-((oxybis(methylene))bis(4,1-phenylene))bis(3-(trifluoromethyl)-3H-diazirine);

3,3'-((oxybis(ethane-2,1-diyl))bis(4,1-phenylene))bis(3-(trifluoromethyl)-3H-diazirine);

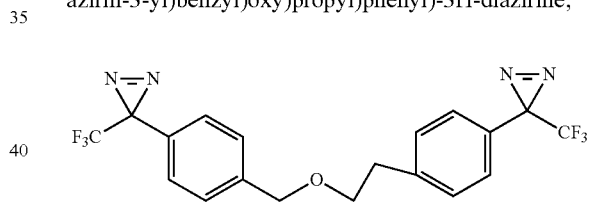

3-(trifluoromethyl)-3-(4-(3-((4-(3-(trifluoromethyl)-3H-diazirin-3-yl)benzyl)oxy)propyl)phenyl)-3H-diazirine;

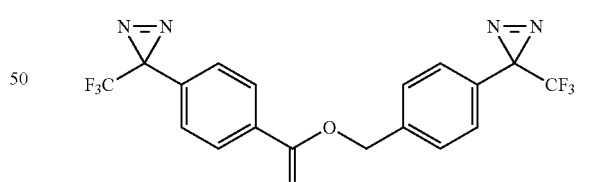

3-(trifluoromethyl)-3-(4-(2-((4-(3-(trifluoromethyl)-3H-diazirin-3-yl)benzyl)oxy)ethyl)phenyl)-3H-diazirine;

4-(3-(trifluoromethyl)-3H-diazirin-3-yl)benzyl 4-(3-(trifluoromethyl)-3H-diazirin-3-yl)benzoate;

4-(3-(trifluoromethyl)-3H-diazirin-3-yl)phenethyl 2-(4-(3-(trifluoromethyl)-3H-diazirin-3-yl)phenyl)acetate;

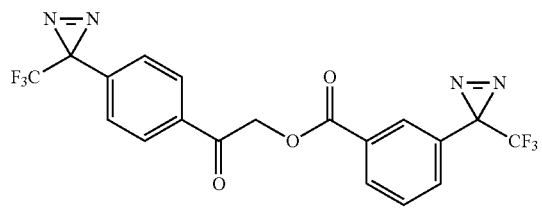 [SMILES: O=C(COC(=O)c1cccc(C2(C(F)(F)F)N=N2)c1)c1ccc(C2(C(F)(F)F)N=N2)cc1]

2-oxo-2-(4-(3-(trifluoromethyl)-3H-diazirin-3-yl)phenyl) ethyl 3-(3-(trifluoromethyl)-3H-diazirin-3-yl)benzoate;

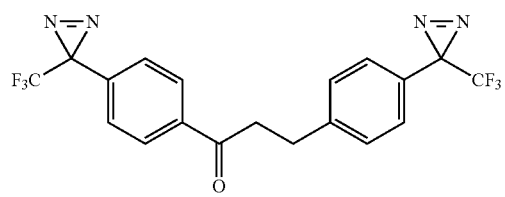 [SMILES: O=C(CCc1ccc(C2(C(F)(F)F)N=N2)cc1)c1ccc(C2(C(F)(F)F)N=N2)cc1]

1,3-bis(4-(3-(trifluoromethyl)-3H-diazirin-3-yl)phenyl)propan-1-one;

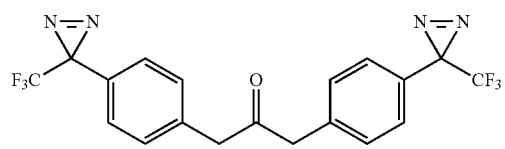 [SMILES: O=C(Cc1ccc(C2(C(F)(F)F)N=N2)cc1)Cc1ccc(C2(C(F)(F)F)N=N2)cc1]

1,3-bis(4-(3-(trifluoromethyl)-3H-diazirin-3-yl)phenyl)propan-2-one;

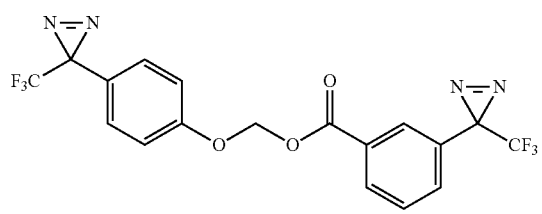 [SMILES: O=C(OCOc1ccc(C2(C(F)(F)F)N=N2)cc1)c1cccc(C2(C(F)(F)F)N=N2)c1]

(4-(3-(trifluoromethyl)-3H-diazirin-3-yl)phenoxy)methyl 3-(3-(trifluoromethyl)-3H-diazirin-3-yl)benzoate;

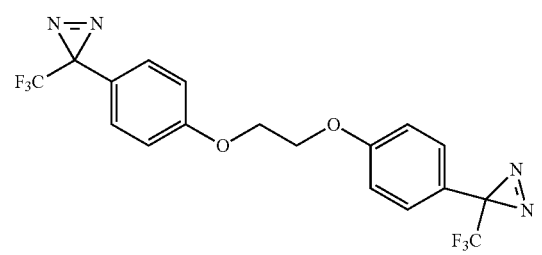 [SMILES: FC(F)(F)C1(c2ccc(OCCOc3ccc(C4(C(F)(F)F)N=N4)cc3)cc2)N=N1]

1,2-bis(4-(3-(trifluoromethyl)-3H-diazirin-3-yl)phenoxy)ethane;

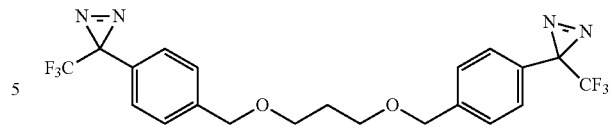

1,3-bis((4-(3-(trifluoromethyl)-3H-diazirin-3-yl)benzyl)oxy)propane;

1,5-bis((4-(3-(trifluoromethyl)-3H-diazirin-3-yl)benzyl)oxy)pentane;

3,3'-(((((oxybis(ethane-2,1-diyl))bis(oxy))bis(methylene))bis(4,1-phenylene))bis(3-(trifluoromethyl)-3H-diazirine);

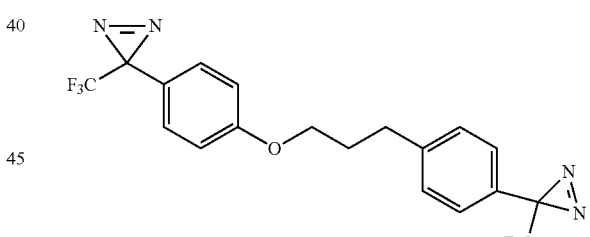

3-(trifluoromethyl)-3-(4-(3-(4-(3-(trifluoromethyl)-3H-diazirin-3-yl)phenoxy)propyl)phenyl)-3H-diazirine;

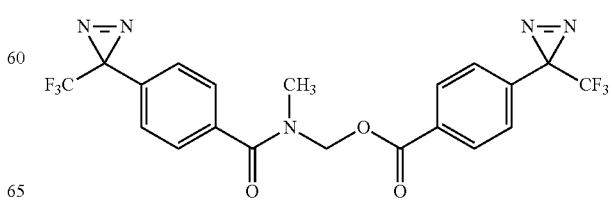

(N-methyl-4-(3-(trifluoromethyl)-3H-diazirin-3-yl)benzamido)methyl 4-(3-(trifluoromethyl)-3H-diazirin-3-yl)benzoate; and

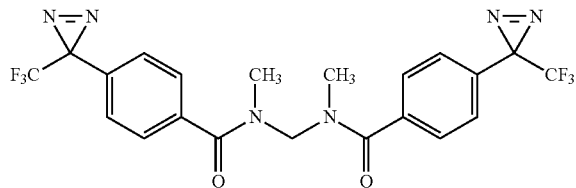 [SMILES: CN(CN(C)C(=O)c1ccc(C2(C(F)(F)F)N=N2)cc1)C(=O)c1ccc(C2(C(F)(F)F)N=N2)cc1]

N,N'-methylenebis(N-methyl-4-(3-(trifluoromethyl)-3H-diazirin-3-yl)benzamide).

Other preferred embodiments in accordance with the present invention relate to a composition encompassing the polycycloolefinic polymer of formulae (I) to (IV) and a casting or printing solvent as already described hereinabove and hereinbelow.

In some preferred composition embodiments in accordance with the present invention the solvent is selected from organic solvents as described hereinbelow and hereinabove. In other embodiments the solvent includes, without limitation, cyclohexylbenzene, mesitylene, indan, xylene, tetralin, diethylbenzene, cyclopentanone, benzyl acetate or combinations of the aforementioned.

In other preferred composition embodiments in accordance with the present invention the concentration of the polycycloolefinic polymer in the composition is from 0.1% to 20%, preferably from 0.5% to 10%, and very preferably from 1% to 5%.

The aforementioned concentration values refer to the composition encompassing the solvent(s) and all solid components such as the polycycloolefinic polymer which are dissolved in the solvent.

In some preferred composition embodiments in accordance with the present invention the OSC can be an n- or p-type OSC. Effective OSCs exhibit a FET mobility of greater than $1 \times 10^{-5}$ $cm^2V^{-1}s^{-1}$.

The OSC material employed for device embodiments in accordance with the present invention can be any conjugated molecule, for example, an aromatic molecule containing two or more, more specifically at least three aromatic rings. In some preferred OSC embodiments of the present invention, the OSC contains aromatic rings selected from 5-, 6- or 7-membered aromatic rings, while in other preferred embodiments the OSC contains aromatic rings selected from 5- or 6-membered aromatic rings. The OSC material can be a monomer, oligomer or polymer, including mixtures, dispersions and blends of one or more of monomers, oligomers or polymers.

Each of the aromatic rings of the OSC optionally contains one or more hetero atoms selected from Se, Te, P, Si, B, As, N, O or S, generally from N, O or S. Further, the aromatic rings can be optionally substituted with fluoro, cyano, alkyl, alkoxy, polyalkoxy, thioalkyl, silyl, ethynylsilyl, optionally substituted secondary or tertiary alkylamine or arylamine, aryl or substituted aryl groups, wherein ethynylsilyl groups are represented by —C≡C—SiR'R''R''', and substituted secondary or tertiary alkylamine or arylamine are represented by —N(R')(R''), wherein R' and R'' are each independently H, optionally fluorinated $C_{1-12}$ alkyl or optionally fluorinated $C_{6-10}$ aryl.

The aforementioned aromatic rings can be fused rings or linked with a conjugated linking group such as —C(T')═C(T'')—, —C≡C—, —N(R'''')—, —N═N—, (R'''')═N—, —N═C(R'''')—, where T' and T'' each independently represent H, Cl, F, —C≡N or lower alkyl groups such as $C_{1-4}$ alkyl groups and R'''' is as defined above.

In other preferred composition embodiments in accordance with the present invention, OSC materials that can be used include compounds, oligomers and derivatives of compounds selected from the group consisting of condensed aromatic hydrocarbons, such as, tetracene, chrysene, pentacene, pyrene, perylene, coronene, or soluble substituted and/or heterocylic derivatives of the aforementioned; oligomeric para substituted phenylenes such as p-quaterphenyl (p-4P), p-quinquephenyl (p-5P), p-sexiphenyl (p-6P) or soluble substituted derivatives of these; benzidine compounds; stilbene compounds; triazines; substituted metallo- or metal-free porphines, phthalocyanines, fluorophthalocyanines, naphthalocyanines or fluoronaphthalocyanines; $C_{60}$ and $C_{70}$ fullerenes; N,N'-dialkyl, substituted dialkyl, diary or substituted diaryl-1,4,5,8-naphthalene-tetracarboxylic diimide and fluoro derivatives; N,N'-dialkyl, substituted dialkyl, diaryl or substituted diaryl 3,4,9,10-perylenetetracarboxylic diimide; batho-phenanthroline; diphenoquinones; 1,3,4-oxadiazoles; 11,11,12,12-tetracyano-naptho-2,6-quinodimethane; α,α'-bis(dithieno[3,2-b2',3'-d]thiophene); 2,8-dialkyl, substituted dialkyl, diaryl or substituted diaryl anthradithiophene; 2,2'-bibenzo[1,2-b:4,5-b']dithiophene. Where a liquid deposition technique of the OSC is desired, compounds from the above list and derivatives thereof are limited to those that are soluble in an appropriate solvent or mixture of appropriate solvents.

In other preferred composition embodiments in accordance with the present invention, the OSC materials are substituted oligoacenes such as pentacene, tetracene or anthracene, or heterocyclic derivatives thereof, more specifically oligoacenes that are substituted with alkylsilylethynyl groups, such as, bis(trialkylsilylethynyl) oligoacenes or bis(trialkylsilylethynyl) heteroacenes, for example, optionally fluorinated bis(trialkylsilylethynyl) anthradithiophenes, as disclosed for example in U.S. Pat. No. 6,690,029, WO 2005/055248 A1 or U.S. Pat. No. 7,385,221.

Where appropriate and needed to adjust the rheological properties of the OSC composition, as described for example in WO 2005/055248 A1, some embodiments of the present invention employ OSC compositions that include one or more organic binders in addition to the polycycloolefinic polymer. In other embodiments the OSC composition does not include an organic binder in addition to the polycycloolefinic polymer.

Other preferred embodiments in accordance with the invention relate to an OSC layer that is obtained through the use of an OSC composition in accordance with the present invention.

Other preferred embodiments in accordance with the present invention relate to a process of preparing an OSC layer, encompassing depositing an OSC composition in accordance with the present invention onto a substrate and, in case the OSC composition encompasses a solvent, removing the solvent.

In some preferred OSC layer embodiments in accordance with the present invention, deposition and/or forming of the OSC layer are performed using solution processing techniques. For example, a composition of the OSC and the polycycloolefinic polymer, typically a solution encompassing one or more organic solvents, can be deposited or formed using preferred techniques that include, but are not limited to, dip coating, slot-die coating spin coating, ink jet printing, letter-press printing, screen printing, doctor blade coating, roller printing, reverse-roller printing, offset lithography printing, flexographic printing, web printing, spray coating, brush coating, or pad printing, followed by the evaporation of the solvent employed to form such a solution. For example, an OSC material, a bank structure material and an organic dielectric material can each be deposited or formed by spin coating, flexographic printing, and inkjet printing techniques in an order appropriate to the device being formed.

In other preferred OSC layer embodiments in accordance with the present invention the concentration of the polycycloolefinic polymer in the OSC layer after deposition and solvent removal is from 2.5 to 25%, more specifically from 10 to 15%.

Other preferred embodiments in accordance with the present invention relate to an OE device encompassing an OSC layer and a passivation layer, wherein the OSC layer is obtained through the use of an OSC composition in accordance with the invention, and the passivation layer is obtained by vapor deposition of a p-xylylene, thus forming a layer of poly(p-xylylene).

In some preferred OE device embodiments in accordance with the present invention the poly(p-xylylene) is Parylene C.

Suitable process conditions for the vapor deposition process of p-xylylene are known to the skilled person and are described in the literature, for example, in P. Kramer et al., *Journal of Polymer Science: Polymer Chemistry Edition*, Vol. 22 (1984), pp. 475-491.

In some preferred OE device embodiments in accordance with the present invention the OE device encompasses an OSC layer and a dielectric or passivation layer, wherein the OSC layer is obtained through the use of an OSC composition encompassing an OSC and a polycycloolefinic polymer having one or more reactive groups, and the dielectric or passivation layer is obtained by vapor deposition of a p-xylylene on the OSC layer, thus forming a layer of a poly(p-xylylene) on the OSC layer, and wherein the reactive groups of the polycycloolefinic polymer react with unsaturated groups of the p-xylylene at the interface between the OSC layer and the dielectric or passivation layer during vapor deposition of the p-xylylene, resulting in chemical bonding of the polycycloolefinic polymer of the OSC layer with the poly(p-xylylene) of the dielectric or passivation layer at the interface between the OSC layer and the dielectric or passivation layer.

Preferred OE device embodiments in accordance with the present invention include, without limitation, organic field effect transistors (OFETs), organic thin film transistors (OTFTs), which can be top gate or bottom gate transistors, Organic Light Emitting Diodes (OLED), Organic Photodetecting (OPD) Devices or Organic Photovoltaic (OPV) Devices.

Some preferred OE device embodiments in accordance with the present invention can be, for example, OFETs where the OSC is used as the active channel material, OPV devices where the OSC is used as charge carrier material, or organic rectifying diodes (ORDs) where the OSC is a layer element of such a diode. OSCs for such embodiments can be deposited by any of the previously discussed deposition methods, but as they are generally deposited or formed as blanket layers, solvent coated methods such as spray-, dip-, web- or spin-coating, or printing methods such as ink-jet printing, flexo printing or gravure printing, are typically employed to allow for ambient temperature processing.

In some preferred OE device embodiments the OE device is a bottom gate or top gate OFET encompassing a gate dielectric layer encompassing a polycycloolefinic polymer as described above and below.

In other preferred OE device embodiments the OE device is a bottom gate or top gate OFET encompassing a passivation layer encompassing a polycycloolefinic polymer as described above and below.

Other preferred embodiments in accordance with the present invention relate to a process of preparing an OE device encompassing a dielectric or passivation layer comprising a polycycloolefinic polymer as described above and below, said OE device further encompassing an OSC layer being obtained by solution deposition of an OSC material.

Other preferred embodiments of the present invention relate to a process of preparing an OE device, encompassing the following steps in an appropriate sequence:

a) depositing an OSC material, preferably from an organic solution, to form an OSC layer, b) depositing source and drain electrodes, c) depositing a gate electrode, b) depositing a polycycloolefinic polymer as described above and below, preferably from an organic solution, to form a dielectric layer.

Figure 2:
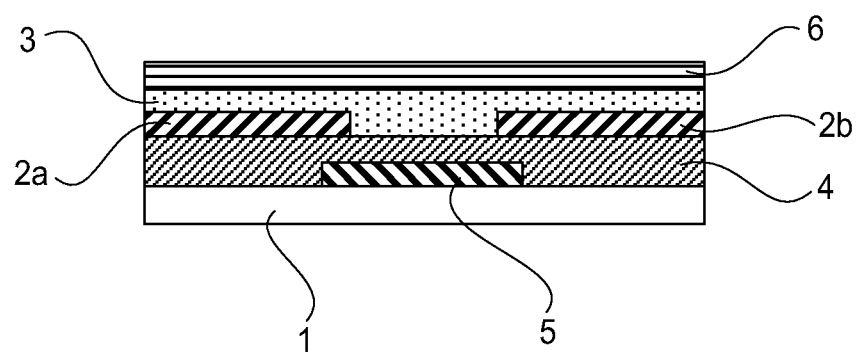
FIG. 2 is a schematic representation of a bottom gate OFET device embodiment in accordance with the present invention.

A top gate OFET in accordance with one preferred embodiment of the present invention is depicted schematically in FIG. 1, and a bottom gate OFET in accordance with another embodiment of the present invention is depicted schematically in FIG. 2.

Turning now to FIG. 1, a schematic and simplified representation of a top gate OFET device in accordance with a preferred embodiment of the present invention is provided. Such OFET device includes a substrate (1), source and drain electrodes (2a, 2b), an OSC layer (3), a dielectric layer (4) encompassing a polycycloolefinic polymer as described above and below and serving as gate insulator, and a gate electrode (5).

Other preferred embodiments in accordance with the present invention relate to a process for preparing a top gate OFET device, for example, as illustrated in FIG. 1, by a process encompassing:

a) forming source and drain electrodes (2a, 2b) on a substrate (1), b) forming an OSC layer (3) by deposition of an OSC material, preferably from an organic solution, on the source and drain electrodes (2a, 2b), c) forming a dielectric layer (4) by deposition of a polycycloolefinic polymer as described above and below, preferably from an organic solution, on the OSC layer (3), d) forming a gate electrode (5) on the dielectric layer (4).

Turning now to FIG. 2, a schematic and simplified representation of a bottom gate OFET device in accordance with another embodiment of the present invention is provided. Such OFET device includes a substrate (1), a gate electrode (5), a dielectric layer (4) comprising a polycycloolefinic polymer as described above and below serving as gate insulator, source and drain electrodes (2a, 2b), an OSC layer (3), and optionally a passivation layer (6).

Other preferred embodiments in accordance with the present invention relate to a process for preparing a bottom gate OFET device, for example, as illustrated in FIG. 2, by a process encompassing:

a) forming a gate electrode (5) on a substrate (1), b) forming a dielectric layer (4) by deposition of a polycycloolefinic polymer as described above and below, preferably from an organic solution, on the substrate (1) and the gate electrode (5), c) forming source and drain electrodes (2a, 2b) on the dielectric layer (4).

d) forming an OSC layer (3) by deposition of an OSC material, preferably from an organic solution, on the source and drain electrodes (2a, 2b) and the dielectric layer (4), e) optionally forming a passivation layer (6) by deposition of a dielectric material on the OSC layer (3).

In the aforementioned processes, the electrodes (2a, 2b, 5) are for example applied onto the substrate (1) or the dielectric layer (4) by a sputtering process, and can be patterned by etching and/or lithographic patterning. The OSC layer (3) and dielectric layer (4) can be applied by a coating or printing process as described above.

The other components or functional layers of the OE and OFET devices, like the substrate and the gate, source and drain electrodes, can be selected from standard materials, and can be manufactured and applied to the device by standard methods. Suitable materials and manufacturing methods for these components and layers are known to a person skilled in the art and are described in the literature. Exemplary deposition methods include the liquid coating methods previously described as well as chemical vapor deposition (CVD) or physical vapor deposition methodologies.

The gate, source and drain electrodes in the OFET device embodiments in accordance with the present invention can be deposited or formed by liquid coating, such as spray-, dip-, web- or spin-coating, or by vacuum deposition methods including but not limited to physical vapor deposition (PVD), chemical vapor deposition (CVD) or thermal evaporation methods. Suitable electrode materials and deposition methods are known to the person skilled in the art. Suitable electrode materials include, without limitation, inorganic or organic materials, or composites of the two. Exemplary electrode materials include polyaniline, polypyrrole, poly(3,4-ethylenedioxy-thiophene) (PEDOT) or doped conjugated polymers, further dispersions or pastes of graphite or particles of metal such as Au, Ag, Cu, Al, Ni or their mixtures as well as sputter coated or evaporated metals such as Cu, Cr, Pt/Pd, Ag, Au or metal oxides such as indium tin oxide (ITO) F-doped ITO or Al-doped ZnO. Organometallic precursors can also be used and deposited from a liquid phase.

Generally, the thickness of a functional layer, for example a gate dielectric or OSC layer, in some preferred OE and OFET device embodiments in accordance with the present invention is from 0.001 (in case of a monolayer) to 10 μm. In some other preferred embodiments such thickness ranges from 0.001 to 1 μm, and in still other preferred embodiments from 5 nm to 500 nm, although other thicknesses or ranges of thickness are contemplated and thus are within the scope of the present invention.

Various substrates may be used for the fabrication of the OE device embodiments of the present invention. For example, glass or polymeric materials are most often used. Suitable and preferred polymeric materials include, but are not limited to, alkyd resins, allyl esters, benzocyclobutenes, butadiene-styrene, cellulose, cellulose acetate, epoxide, epoxy polymers, ethylene-chlorotrifluoro ethylene copolymers, ethylene-tetra-fluoroethylene copolymers, fiber glass enhanced plastic, fluorocarbon polymers, hexafluoropropylene-vinylidene-fluoride copolymer, high density polyethylene, parylene, polyamide, polyimide, polyaramid, polydimethylsiloxane, polyethersulfone, poly-ethylene, polyethylenenaphthalate, polyethyleneterephthalate, polyketone, polymethylmethacrylate, polypropylene, polystyrene, polysulfone, polytetrafluoroethylene, polyurethanes, polyvinylchloride, polycycloolefin, silicone rubbers, and silicones, where polyethyleneterephthalate, polyimide, polycycloolefin and polyethylenenaphthalate materials have been found most appropriate. Additionally, for some preferred embodiments of the present invention the substrate can be any suitable material, for example, plastic, metal or glass material coated with one or more of the above listed materials. It will be understood that in forming such a substrate, methods, such as, extruding, stretching, rubbing or photochemical techniques can be employed to provide a homogeneous surface for device fabrication as well as to provide pre-alignment of an organic semiconductor material in order to enhance carrier mobility therein.

Unless the context clearly indicates otherwise, as used herein plural forms of the terms herein are to be construed as including the singular form and vice versa.

It will be appreciated that variations to the foregoing embodiments of the invention can be made while still falling within the scope of the invention. Each feature disclosed in this specification, unless stated otherwise, can be replaced by alternative features serving the same, equivalent or similar purpose. Thus, unless stated otherwise, each feature disclosed is one example only of a generic series of equivalent or similar features.

All of the features disclosed in this specification can be combined in any combination, except combinations where at least some of such features and/or steps are mutually exclusive. In particular, the features of the invention are applicable to all aspects of the invention and can be used in any combination. Likewise, features described in non-essential combinations can be used separately (not in combination).

The invention will now be described in more detail by reference to the following examples, which are illustrative only and do not limit the scope of the invention.

EXAMPLES

The following abbreviations have been used hereinbefore and hereafter in describing some of the compounds, instruments and/or methods employed to illustrate certain of the embodiments of this invention:

pHexylNB: poly(5-hexyl-bicyclo[2.2.1]hept-2-ene), pDecylNB: poly(5-decyl-bicyclo[2.2.1]hept-2-ene), pBuDM-MINB: poly(1-(4-(bicyclo[2.2.1]hept-5-en-2-yl)butyl)-3,4-dimethyl-1H-pyrrole-2,5-dione), Zeonex480: ROMP polymerized norbornene from Nippon Zeon Co., Ltd., Topas 6013S-04: copolymer of norbornene and ethylene from Topas Advanced Polymers, phr: parts per hundred parts resin or polymer as described herein, CPTX: 1-chloro-4-propoxythioxanthone.

Above and below, unless stated otherwise percentages are percent by weight and temperatures are given in degrees Celsius (° C.). The values of the dielectric constant ε ("permittivity") refer to values taken at 20° C. and 1,000 Hz.

Example 1

The efficiency of crosslinking with bis-diazirine, propane-1,3-diyl bis(4-(3-(trifluoromethyl)-3H-diazirin-3-yl)benzoate) (BDA), using a light source at 365 nm and at a dosage as summarized in Table 1 was tested with four polymers: pHexylNB, pDecylNB, Zeonex480 and Topas 6013S-04.

TABLE 1

| Sample | FT loss (%) |
|---|---|
| pHexylNB, 12.5% decane + 10 phr BDA, 1.95 J/cm$^2$ | 4 |
| pHexylNB, 12.5% decane + 10 phr BDA, 0.8 J/cm$^2$ | 5 |

TABLE 1-continued

| Sample | FT loss (%) |
|---|---|
| pHexylNB, 12.5% decane + 10 phr BDA, 5 min@140° C. | 17 |
| pHexylNB, 12.5% decane + 30 phr BDA, 1.95 J/cm$^2$ | 2 |
| pHexylNB, 12.5% decane + 30 phr BDA, 0.8 J/cm$^2$ | 2 |
| pHexylNB, 12.5% decane + 30 phr BDA, 5 min@140° C. | 3 |
| pDecylNB, 12% in decane + 10 phr BDA, 1.95 J/cm$^2$ | 7 |
| pDecylNB, 12% in decane + 10 phr BDA, 0.78 J/cm$^2$ | 6 |
| pDecylNB, 12% in decane + 10 phr BDA, 5 mins@ 140° C. | 50 |
| pDecylNB, 12% in decane + 10 phr BDA, 15 mins@ 140° C. | 47 |
| Zeonex 480, 10% in p-menthane + 10 phr BDA, 1.95 J/cm$^2$ | 23 |
| Topas 6013S-04, 8% in p-menthane + 10 phr BDA, 1.95 J/cm$^2$ | 6 |

FT—film thickness

The polymer solutions formulated with BDA were spin-coated on glass, dried for 4 minutes at 70° C. and exposed to the UV light. Further, immersion into the carrier solvent for 30 seconds followed, then drying at 100° C. Film thicknesses were measured on Bruker Dektak before and after immersion into the solvent. Table 1 demonstrates the film thickness (FT) losses in percentage for each polymer. For pHexylNB, crosslinking was investigated with the standard loading of the crosslinker (10 part per hundred of polymer) and a much higher loading. Thermal treatment efficiency has also been investigated.

From the results summarized in Table 1, it is apparent that BDA functions as an excellent crosslinker at 365 nm on a range of polymers tested. However, BDA functions less efficiently under thermal treatment alone.

Example 2

To assess the OTFT performance of the materials they were used to construct standard top gate, bottom contact OFET devices, using the OSC polymer Lisicon®SP400 (obtained from Merck GmbH).

The dielectric constants (k-values) were measured prior to the TFT device fabrication in order to enable calculation of charge carrier mobilities in these TFTs. The constants were extracted from the measured capacitance of individual dielectrics in a built capacitor device. The capacitor device was made by spincoating and curing the dielectric on ITO-coated glass, followed by deposition of the second electrode, in this case silver. Capacitor performance was then measured.

TABLE 2

| Sample | Dielectric constant |
|---|---|
| pHexylNB + 10 phr BDA, no UV-exposure | 2.05 |
| pHexylNB + 10 phr BDA, 1.95 J/cm$^2$ | 2.09 |
| Zeonex 480, 10% in p-menthane + 10 phr BDA, no UV-exposure | 2.23 |
| Zeonex 480, 10% in p-menthane + 10 phr BDA, 1.95 J/cm$^2$ | 2.32 |
| Topas 6013S-04, 8% in p-menthane + 10 phr BDA, no UV-exposure | 2.20 |
| Topas 6013S-04, 8% in p-menthane + 10 phr BDA, 1.95 J/cm$^2$ | 2.36 |

The dielectric constant measurements are summarized in Table 2. It is evident that inclusion of the cross-linker moiety, BDA, into the polymer results in a slight increase of the dielectric constant.

For the top gate (TG) device fabrication with pHexylNB as a dielectric layer, a series of solutions were formulated as summarized in Table 3 and then spin coated onto the OSC layer at given spin speeds. The reference OTFTs were fabricated without addition of bis-diazirine, BDA, to the pHexylNB formulation. The pristine film was baked at 100° C. for 2 minutes and the films with added bis-diazirine, BDA, were annealed for 4 minutes at 70° C. after deposition.

TABLE 3

| Formulation | Spin Conditions | Curing Conditions | Film Thickness (nm) |
|---|---|---|---|
| pHexylNB, 12.5% in decane (Ref) | 10 s 500 rpm, 30 s 1800 rpm | No UV | 800 |
| pHexylNB, 12.5% in decane + 10 phr BDA | 10 s 500 rpm, 30 s 1800 rpm | 1.95 J/cm$^2$ | 800 |
| pHexylNB, 12.5% in decane + 30 phr BDA | 10 s 500 rpm, 30 s 1800 rpm | 1.95 J/cm$^2$ | 800 |

Figure 3:
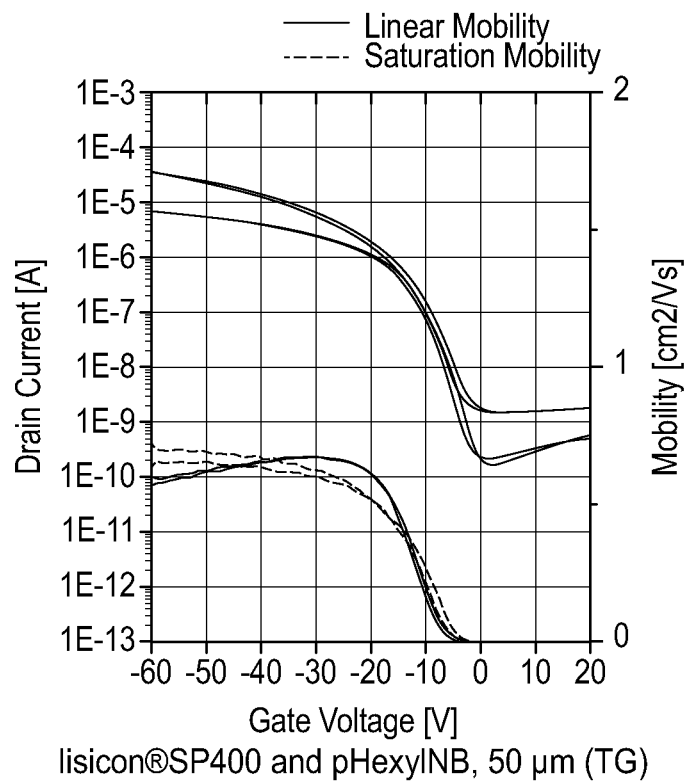
FIGS. 3 to 5 are transfer curves of top gate, bottom contact OFET devices of Example 2.
Figure 4:
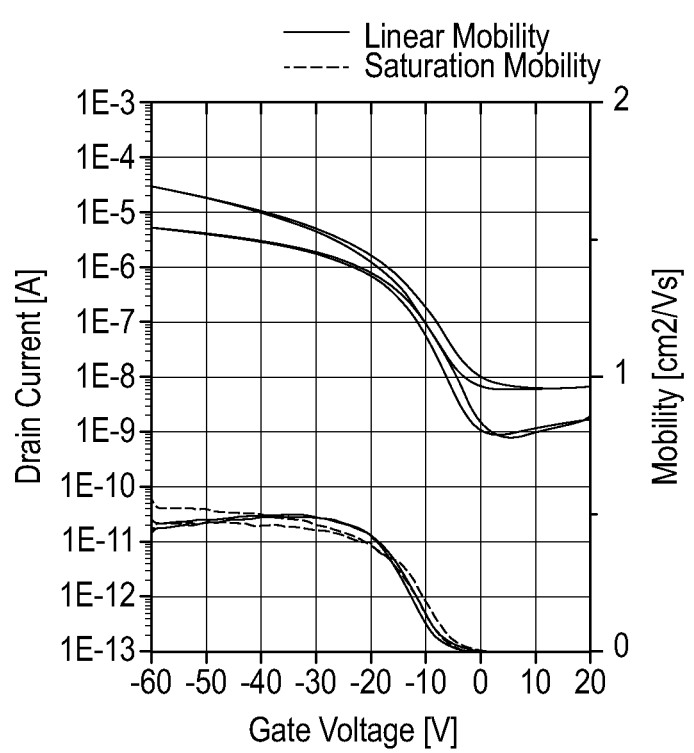
Figure 5:
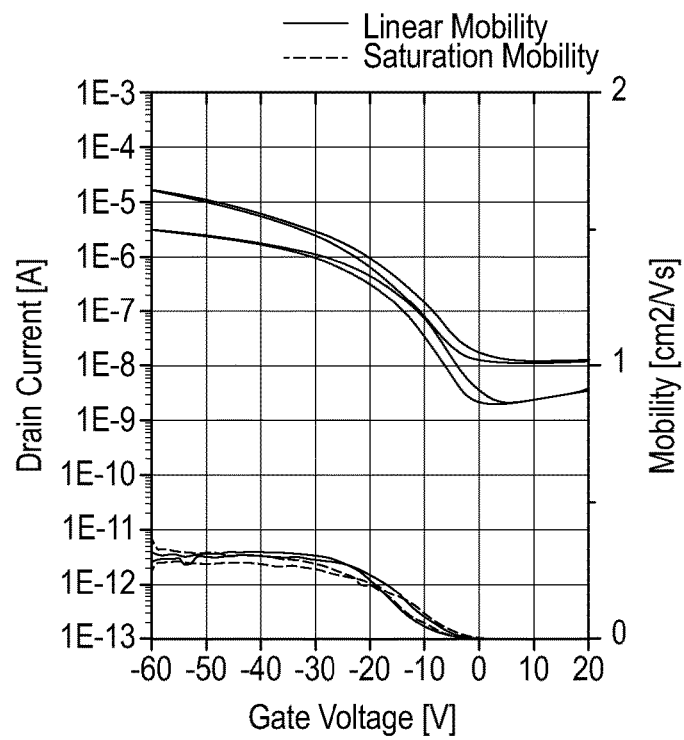

FIGS. 3, 4, and 5 demonstrate the performance on the above mentioned TG OTFTs. It can be clearly noticed that the device performance deteriorated with the cross-linking reaction induced by bis-diazirine (and possibly, by the UV-damage to the OSC material). However, it should be noted that devices still exhibit well-defined transistor performance.

FIG. 3 shows a device incorporating pHexylNB dielectric without any bis-diazirine cross-linker added to the formulation or UV-dose applied to the film. This is therefore used as a reference and to illustrate changes in performance which occur through cross-linker in this experiment.

FIGS. 4 and 5 show device performance obtained with dielectrics that were formulated with 10 and 30 phr of bis-diazirine, respectively, and UV cross-linked at 365 nm. Comparing to the reference device in FIG. 3, the notable performance degradation trend is observed with the increased loading of the cross-linker (e.g., decrease in mobility, increase in off-currents and hysteresis).

Example 3

For the TG device fabrication with pDecylNB dielectric, two solutions were formulated as summarized in Table 4 and then spin coated onto the OSC layer at given spin speeds. The reference OTFTs were fabricated without addition of bis-diazirine to the pDecylNB formulation. The pristine film was baked at 100° C. for 2 minutes and the films with added bis-diazirine were annealed for 4 minutes at 70° C. after deposition.

TABLE 4

| Formulation | Spin Conditions | Curing Conditions | Film Thickness (nm) |
|---|---|---|---|
| pDecylNB, 12% in decane (Ref) | 30 s 1100 rpm | No UV | 760 |
| pDecylNB, 12% in decane + 10 phr BDA | 30 s 1100 rpm | 1.95 J/cm$^2$ | 760 |

Figure 6:
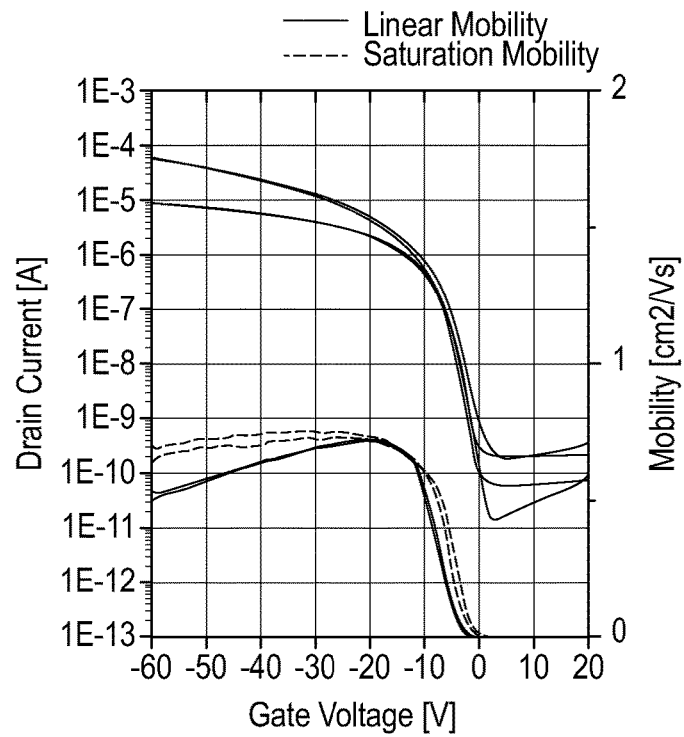
FIGS. 6 and 7 are transfer curves of top gate OTFT devices of Example 3.
Figure 7:
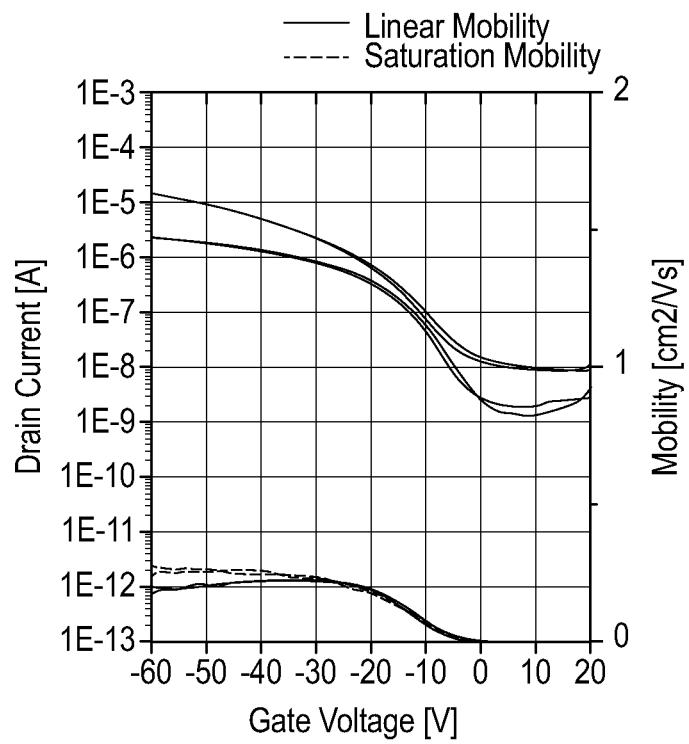

FIGS. 6 and 7 demonstrate the performance on the above mentioned TG OTFTs.

FIG. 6 shows a device incorporating pDecylNB dielectric without any bis-diazirine cross-linker added to the formulation or UV-dose applied to the film. This is therefore used as a reference and to illustrate changes in performance which occur through cross-linker in this experiment.

FIG. 7 shows device performance obtained with dielectric that was formulated with 10 phr of bis-diazirine and UV cross-linked at 365 nm. Comparing to the reference device in FIG. 6, some performance degradation was observed with the addition of the cross-linker (e.g., decrease in mobility, increase in off-current and hysteresis).

Example 4

For the TG device fabrication with Zeonex 480 dielectric, two solutions were formulated as summarized in Table 5 and then spin coated onto the OSC layer at given spin speeds. The reference OTFTs were fabricated without addition of bis-diazirine to the Zeonex 480 formulation. The pristine film was baked at 100° C. for 2 minutes and the films with added bis-diazirine were annealed for 4 minutes at 70° C. after deposition.

TABLE 5

| Formulation | Spin Conditions | Curing Conditions | Film Thickness (nm) |
| --- | --- | --- | --- |
| Zeonex 480, 10% in p-menthane | 30 s 1400 rpm | No UV | 800 |
| Zeonex 480, 10% in p-menthane + 10 phr BDA | 30 s 1400 rpm | 1.95 J/cm$^2$ | 850 |

Figure 8:
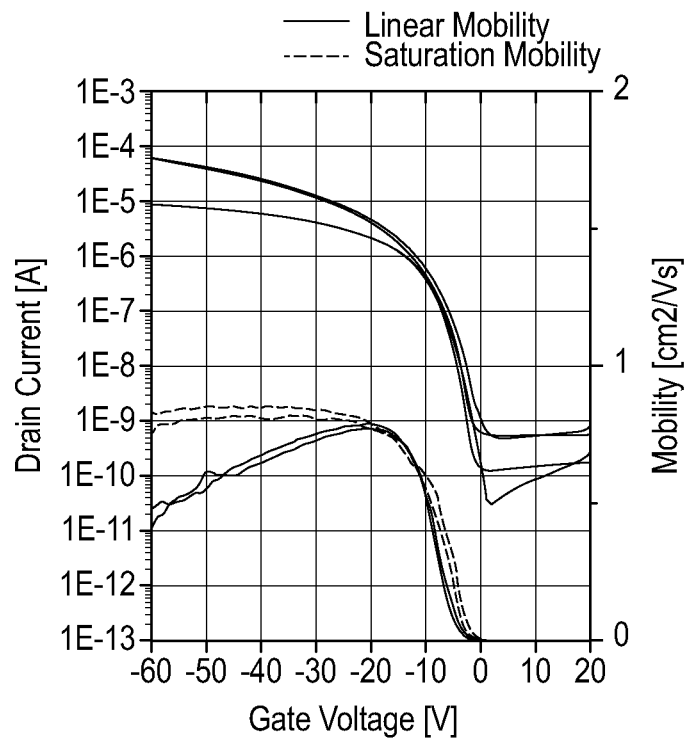
FIGS. 8 and 9 are transfer curves of top gate OTFT devices of Example 4.
Figure 9:
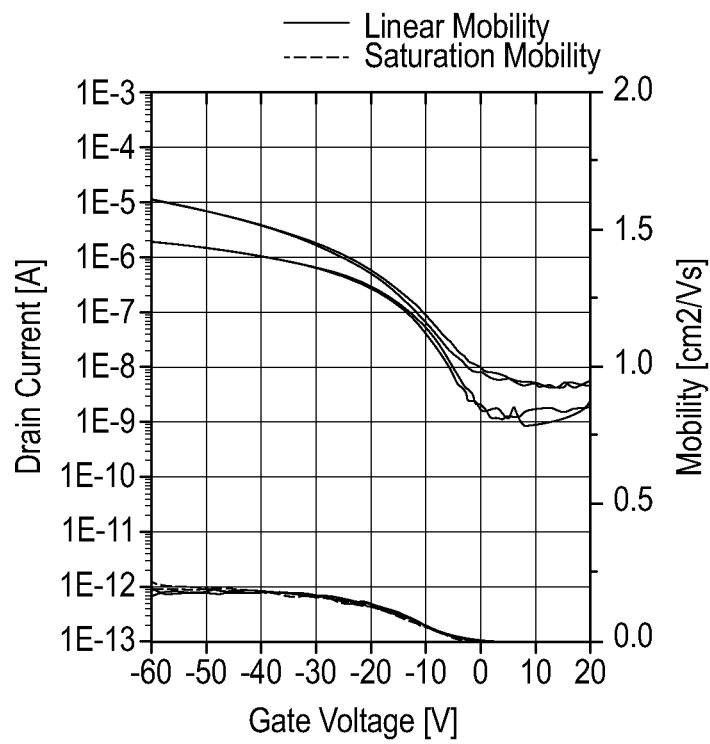

FIGS. 8 and 9 demonstrate the performance on the above mentioned TG OTFTs.

FIG. 8 shows a device incorporating Zeonex 480 dielectric without any bis-diazirine cross-linker added to the formulation or UV-dose applied to the film. This is therefore used as a reference and to illustrate changes in performance which occur through cross-linker in this experiment.

FIG. 9 shows device performance obtained with dielectric that was formulated with 10 phr of bis-diazirine and UV cross-linked at 365 nm. Comparing to the reference device in FIG. 8, the notable performance degradation is observed with the addition of the cross-linker (e.g., decrease in mobility, increase in off-current and hysteresis).

Example 5

For the TG device fabrication with Topas 6013S-04 dielectric, two solutions were formulated as summarized in Table 6 and then spin coated onto the OSC layer at given spin speeds. The reference OTFTs were fabricated without addition of bis-diazirine to the Topas 6013S-04 formulation. The pristine film was baked at 100° C. for 2 minutes and the films with added bis-diazirine were annealed for 4 minutes at 70° C. after deposition.

TABLE 6

| Formulation | Spin Conditions | Curing Conditions | Film Thickness (nm) |
| --- | --- | --- | --- |
| Topas 6013S-04, 8% in p-menthane | 30 s 1200 rpm | No UV | 690 |
| Topas 6013S-04, 8% in p-menthane + 10 phr BDA | 30 s 1200 rpm | 1.95 J/cm$^2$ | 680 |

Figure 10:
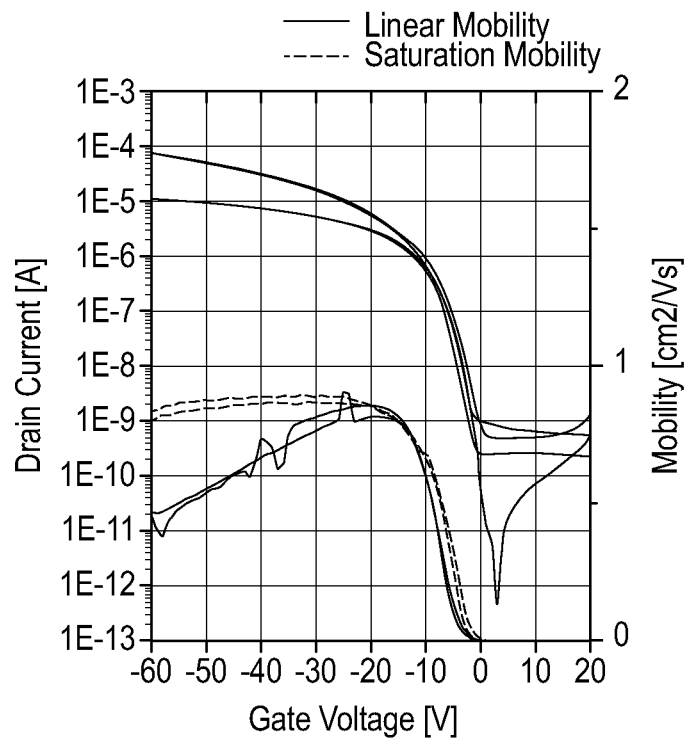
FIGS. 10 and 11 are transfer curves of top gate OTFT devices of Example 5.
Figure 11:
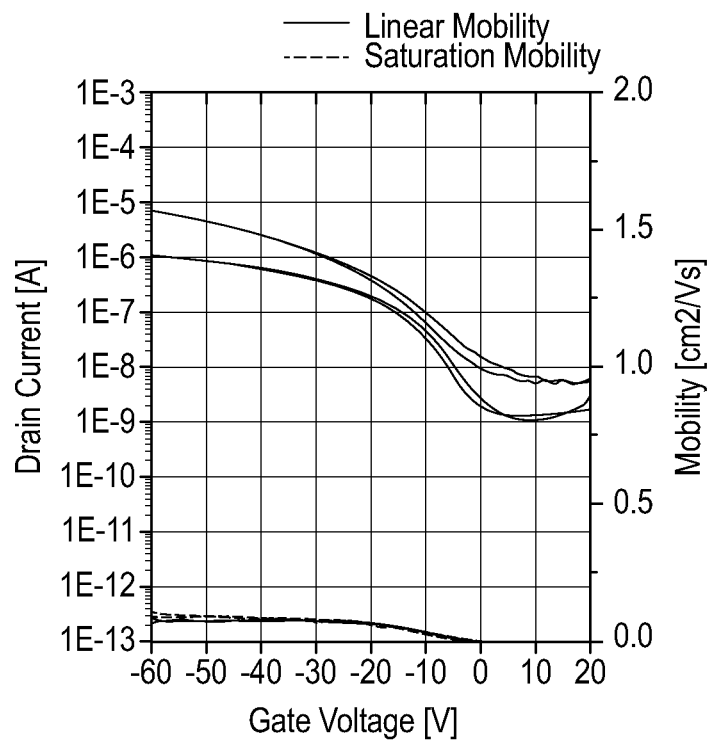

FIGS. 10 and 11 demonstrate the performance on the above mentioned TG OTFTs.

FIG. 10 shows a device incorporating Topas 6014S-04 dielectric without any bis-diazirine cross-linker added to the formulation or UV-dose applied to the film. This is therefore used as a reference and to illustrate changes in performance which occur through cross-linker in this experiment.

FIG. 11 shows device performance obtained with dielectric that was formulated with 10 phr of bis-diazirine and UV cross-linked at 365 nm. Comparing to the reference device in FIG. 10, some performance degradation was observed with the addition of the cross-linker (e.g., decrease in mobility, increase in off-current and hysteresis).

Bottom Gate devices (BG)

Example 6

To assess the OTFT performance of the materials further, standard bottom gate bottom contact devices (FIG. 2) were constructed, using the OSC polymers Lisicon®SP500 and a p(di-indenothienothiophene)-co-(thienothiophene) (pDITT-TT).

For the BG device fabrication with pHexylNB dielectric, two dielectric formulations were prepared, as summarized in Table 7 and then spin coated onto the polymer OSC layer at given spin speeds. Two polymer OSC materials were used in this experiment. The reference OTFTs for each OSC polymer were fabricated with the standard BG dielectric pBuDMMINB that does not contain bis-diazirine in its formulation. The pBuDMMINB film was baked at 100° C. for 2 minutes and the pHexylNB films with added bis-diazirine were annealed for 4 minutes at 70° C. after deposition.

TABLE 7

| Formulation | Spin conditions | Curing conditions | Film Thickness, nm |
| --- | --- | --- | --- |
| pBuDMMINB with 1 phr CPTX, 17.5% in MAK | 30 s 2000 rpm | 2.60 J/cm$^2$ | 1.27 mm |
| pHexylNB, 12% in decane with 10 phr BDA | 30 s 1500 rpm | 1.95 J/cm$^2$ | 0.992 |

FIGS. 12, 13, 14 and 15 demonstrate the performance on the above mentioned BG OTFTs.

Figure 12:
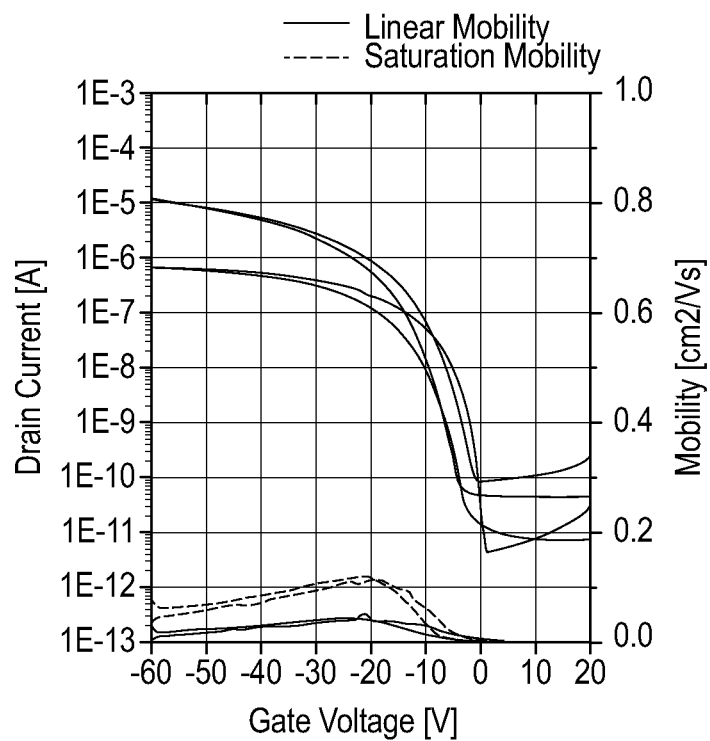
FIGS. 12 to 15 are transfer curves of bottom gate OTFT devices of Example 6.

FIG. 12 shows a BG device incorporating pDITT-TT as OSC and pBuDMMINB as dielectric without any bis-diazirine cross-linker added to the formulation. This is therefore used as a reference and allows to track changes in performance with a different dielectric.

Figure 13:
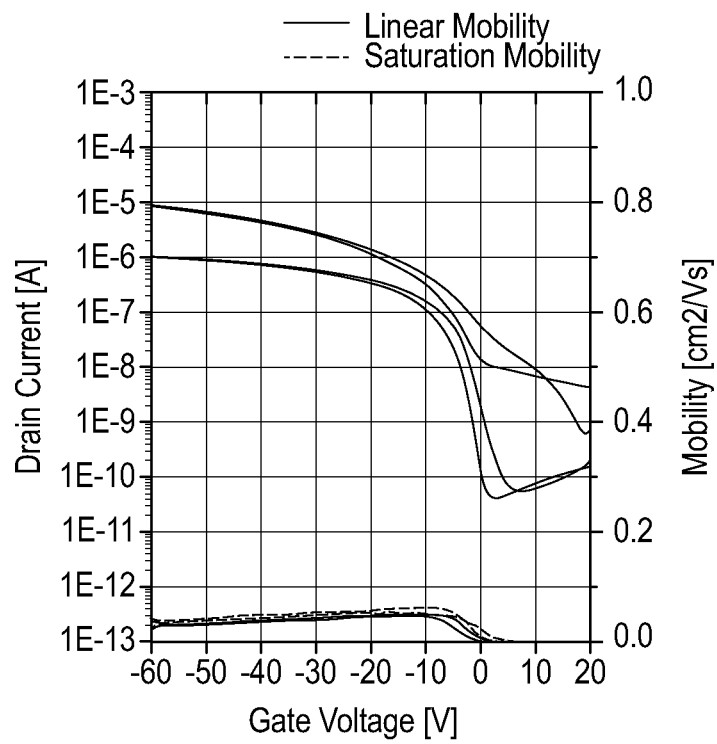

FIG. 13 shows a BG device performance obtained with pDITT-TT as OSC and pHexylNB as dielectric that was formulated with 10 phr of bis-diazirine and UV cross-linked at 365 nm. Comparing to the reference device in FIG. 12, some performance degradation was observed with the new dielectric and change in crosslinking concept, decrease in mobility, increase in off-current and hysteresis.

Figure 14:
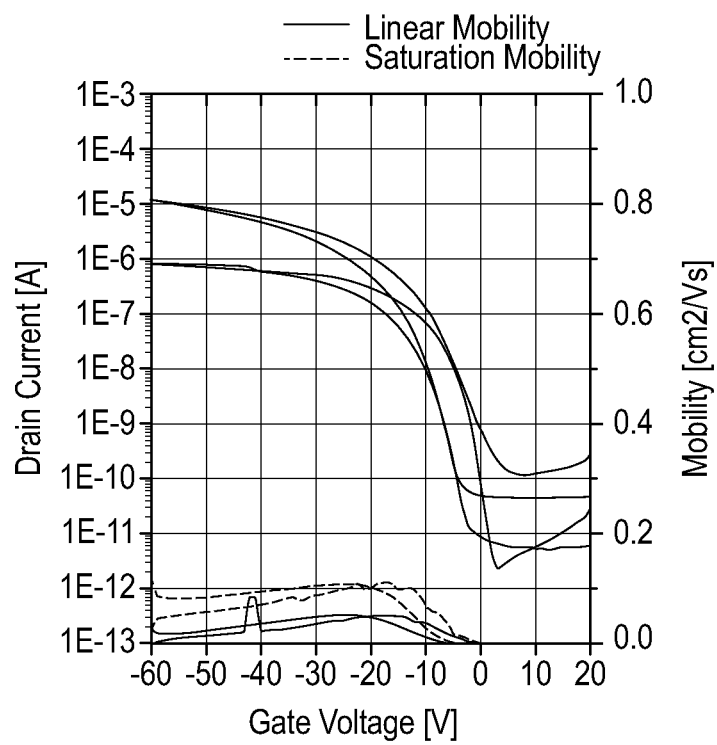

FIG. 14 shows a BG device incorporating Lisicon®SP500 polymer as OSC and pBuDMMINB as dielectric without any bis-diazirine cross-linker added to the formulation. This is therefore used as a reference and allows to track changes in performance with a different dielectric.

Figure 15:
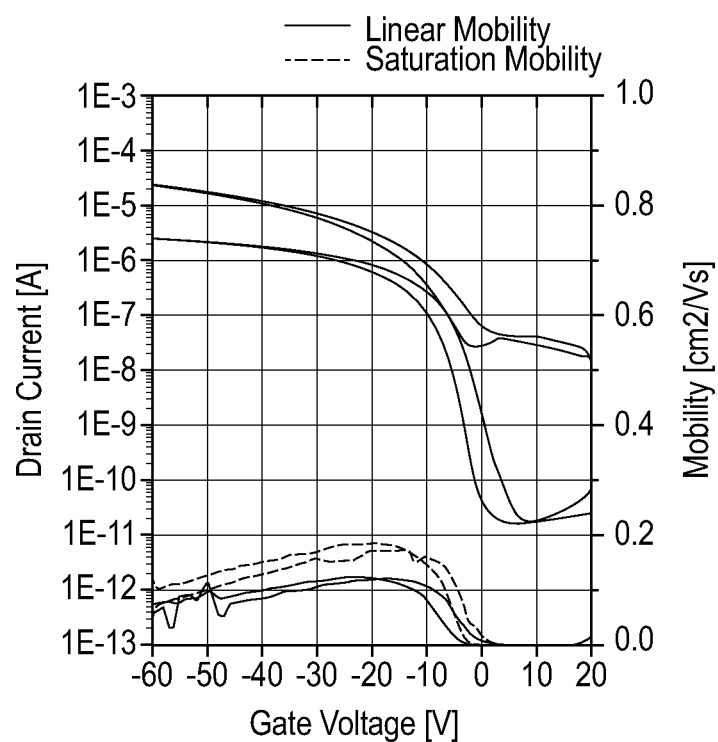

FIG. 15 shows a BG device performance obtained with Lisicon®SP500 as OSC and pHexylNB as dielectric that was formulated with 10 phr of bis-diazirine and UV cross-linked at 365 nm. Comparing to the reference device in FIG. 14, some improved charge carrier mobility is observed. However, other device performance characteristics, such as off-currents and hysteresis, demonstrate some degradation with the change of dielectric and cross-linking concept.

Although the invention has been illustrated by certain of the preceding examples, it is not to be construed as being limited thereby; but rather, the invention encompasses the generic area as hereinbefore disclosed. Various modifications and embodiments can be made without departing from the spirit and scope thereof.

What is claimed is:

1. An organic electronic (OE) device comprising a dielectric layer, said dielectric layer comprising a polycycloolefinic polymer selected from the group consisting of:
   a) a polymer having one or more distinct repeat units of formula (IA), where the repeat units are derived from a monomer of formula (I):

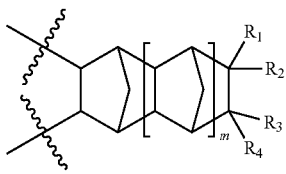
(IA)

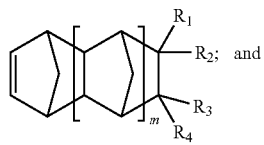
(I)

b) a random copolymer having repeat units of formula (IA) and another olefin, said random copolymer having the formula (II), where the repeat unit of formula (IA) is derived from a monomer of formula (I):

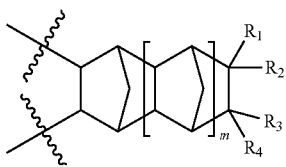
(IA)

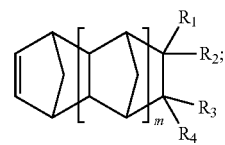
(I)

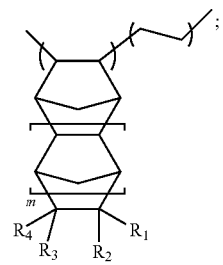
(II)

wherein
m is an integer 0, 1 or 2;
each occurrence of $R_1$, $R_2$, $R_3$ or $R_4$ may be same or different and each independently is hydrogen or a hydrocarbyl selected from the group consisting of linear or branched $(C_1-C_{12})$alkyl, $(C_3-C_{12})$cycloalkyl, $(C_3-C_{12})$cycloalkyl$(C_1-C_{12})$alkyl, $(C_6-C_{12})$bicycloalkyl, $(C_6-C_{12})$bicycloalkyl$(C_1-C_{12})$alkyl, $(C_1-C_{14})$tricycloalkyl, $(C_7-C_{14})$tricycloalkyl$(C_1-C_{12})$alkyl, $(C_6-C_{10})$aryl and $(C_6-C_{10})$aryl$(C_1-C_6)$alkyl;

and a compound of formula (V):

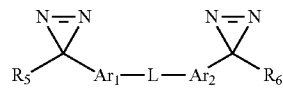
(V)

wherein,
L is a divalent linking or a spacer group selected from:
—C(O)O—$R_7$—OC(O)—, —C(O)O—$R_7$—, —$R_7$—OC(O)—$R_7$—, —C(O)—$R_7$—OC(O)—, —C(O)—$R_7$—, —$R_7$—C(O)—$R_7$—, —O—$R_7$—OC(O)—, —O—$R_7$—O—, —O—$R_7$—, —$R_7$—O—$R_7$—, —C(O)NH—$(CH_2)_b$—NH(CO)—, where b is 1 to 15, —C(O)NH—$(CH_2CH_2O)_c(CH_2)_d$—$NR_5$(CO)—,
where c is 2 to 6 and d is 1 to 6, and each occurrence of $R_7$ may be the same or different which is a divalent group independently selected from $(C_1-C_{12})$alkyl, $(C_3-C_{12})$cycloalkyl, $(C_6-C_{12})$aryl, $(C_6-C_{12})$aryl$(C_1-C_{12})$alkyl, $(C_6-C_{10})$heteroaryl, $(C_6-C_{10})$heteroaryl$(C_1-C_{12})$alkyl, —$(CH_2-CH_2-O)_a$—, where a is an integer from 1 to 10;

$R_5$ and $R_6$ are the same or different and each is independently selected from the group consisting of $(C_1-C_{12})$alkyl, where portions of hydrogen on alkyl are replaced with fluorine, $(C_1-C_{12})$perfluoroalkyl, $(C_6-C_{12})$aryl, $(C_6-C_{12})$aryl$(C_1-C_{12})$alkyl, where portions of hydrogen on alkyl are replaced with fluorine, and $(C_6-C_{12})$arylperfluoro$(C_1-C_{12})$alkyl; and $Ar_1$ and $Ar_2$ are the same or different and each is independently selected from $(C_6-C_{12})$arylene or $(C_6-C_{12})$ heteroarylene group optionally substituted with a group selected from halogen, —OH, $(C_1-C_4)$alkyl, $(C_1-C_4)$ alkoxy, $(C_6-C_{10})$aryl, $(C_6-C_{12})$aryloxy, $(C_6-C_{12})$aryl $(C_1-C_4)$alkyl and $(C_6-C_{12})$aryl$(C_1-C_4)$alkyloxy.

2. The OE device according to claim 1, wherein the polycycloolefinic polymer is having one or more distinct types of repeating units of Formula (IA).

3. The OE device according to claim 1, wherein the polycycloolefinic polymer is of Formula (II).

4. The OE device according to claim 1, which comprises one or more compounds of formula (V) as a crosslinker agent.

5. The OE device according to claim 1, wherein the compound of formula (V) is selected from the group consisting of:

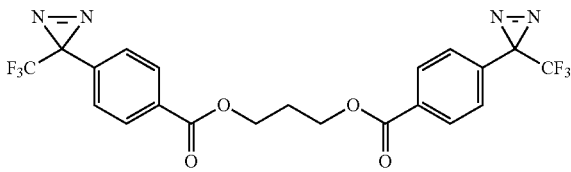 [SMILES: O=C(OCCCOC(=O)c1ccc(C2(C(F)(F)F)N=N2)cc1)c1ccc(C2(C(F)(F)F)N=N2)cc1]

propane-1,3-diyl bis(4-(3-(trifluoromethyl)-3H-diazirin-3-yl)benzoate);

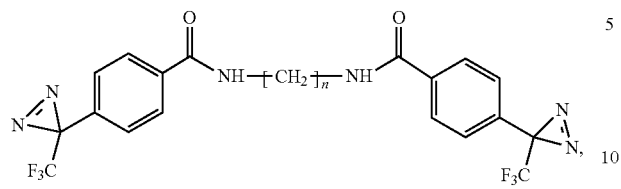

where n is 7 or 12;

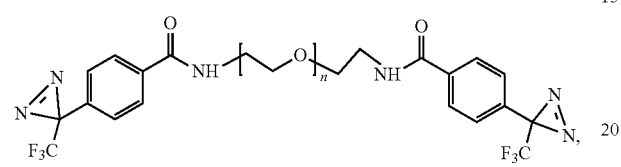

where n is 3 or 5;

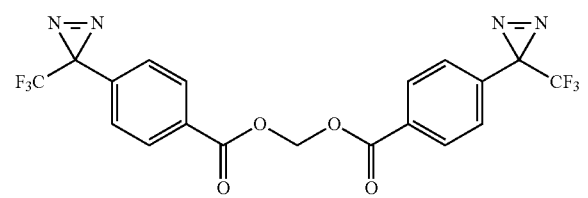 [SMILES: O=C(OCOC(=O)c1ccc(C2(C(F)(F)F)N=N2)cc1)c1ccc(C2(C(F)(F)F)N=N2)cc1]

methylene bis(4-(3-(trifluoromethyl)-3H-diazirin-3-yl)benzoate);

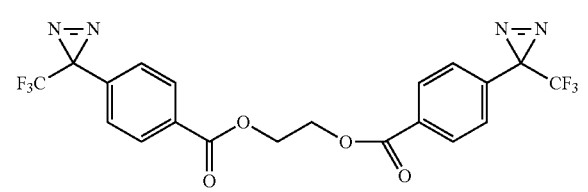 [SMILES: O=C(OCCOC(=O)c1ccc(C2(C(F)(F)F)N=N2)cc1)c1ccc(C2(C(F)(F)F)N=N2)cc1]

ethane-1,2-diyl bis(4-(3-(trifluoromethyl)-3H-diazirin-3-yl)benzoate);

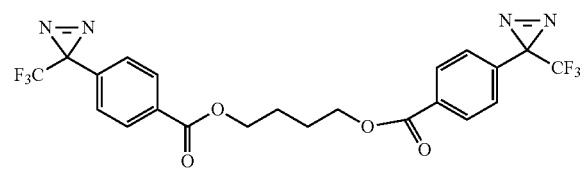 [SMILES: O=C(OCCCCOC(=O)c1ccc(C2(C(F)(F)F)N=N2)cc1)c1ccc(C2(C(F)(F)F)N=N2)cc1]

butane-1,4-diyl bis(4-(3-(trifluoromethyl)-3H-diazirin-3-yl)benzoate);

3,3'-((oxybis(methylene))bis(4,1-phenylene))bis(3-(trifluoromethyl)-3H-diazirine);

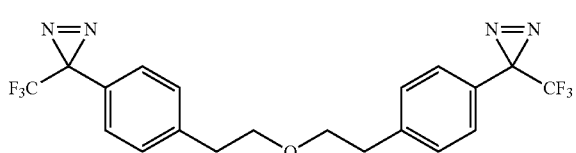 [SMILES: FC(F)(F)C1(c2ccc(CCCOCc3ccc(C4(C(F)(F)F)N=N4)cc3)cc2)N=N1]

3,3'-((oxybis(ethane-2,1-diyl))bis(4,1-phenylene))bis(3-(trifluoromethyl)-3H-diazirine);

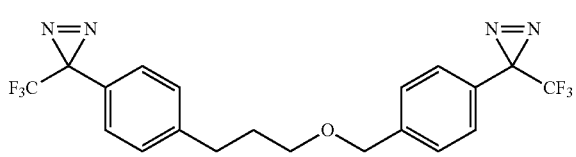

3-(trifluoromethyl)-3-(4-(3-((4-(3-(trifluoromethyl)-3H-diazirin-3-yl)benzyl)oxy)propyl)phenyl)-3H-diazirine;

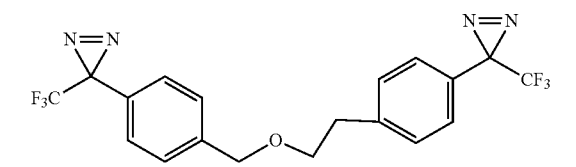 [SMILES: FC(F)(F)C1(c2ccc(CCOCc3ccc(C4(C(F)(F)F)N=N4)cc3)cc2)N=N1]

3-(trifluoromethyl)-3-(4-(2-((4-(3-(trifluoromethyl)-3H-diazirin-3-yl)benzyl)oxy)ethyl)phenyl)-3H-diazirine;

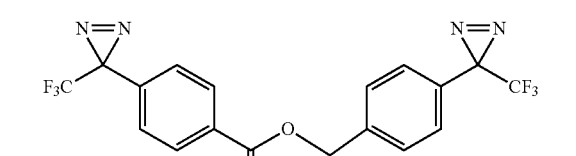

4-(3-(trifluoromethyl)-3H-diazirin-3-yl)benzyl 4-(3-(trifluoromethyl)-3H-diazirin-3-yl)benzoate;

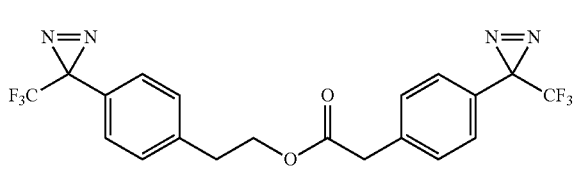 [SMILES: O=C(Cc1ccc(C2(C(F)(F)F)N=N2)cc1)OCCc1ccc(C2(C(F)(F)F)N=N2)cc1]

4-(3-(trifluoromethyl)-3H-diazirin-3-yl)phenethyl 2-(4-(3-(trifluoromethyl)-3H-diazirin-3-yl)phenyl)acetate;

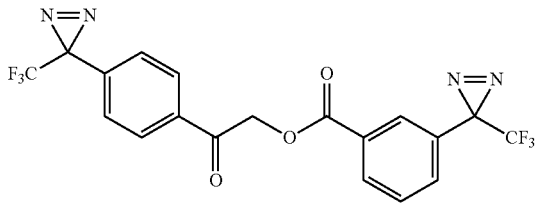 [SMILES: O=C(COC(=O)c1cccc(C2(C(F)(F)F)N=N2)c1)c1ccc(C2(C(F)(F)F)N=N2)cc1]

2-oxo-2-(4-(3-(trifluoromethyl)-3H-diazirin-3-yl)phenyl)ethyl 3-(3-(trifluoromethyl)-3H-diazirin-3-yl)benzoate;

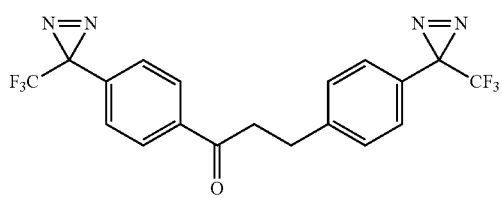

1,3-bis(4-(3-(trifluoromethyl)-3H-diazirin-3-yl)phenyl)propan-1-one;

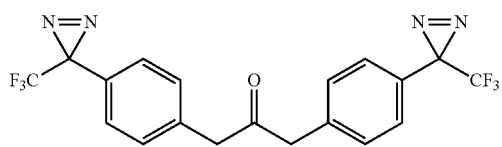

1,3-bis(4-(3-(trifluoromethyl)-3H-diazirin-3-yl)phenyl)propan-2-one;

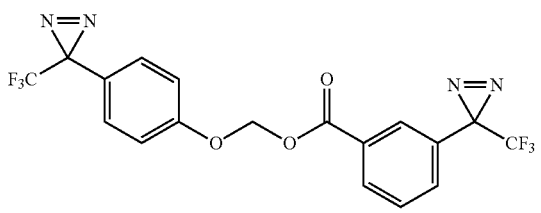 [SMILES: O=C(OCOc1ccc(C2(C(F)(F)F)N=N2)cc1)c1cccc(C2(C(F)(F)F)N=N2)c1]

(4-(3-(trifluoromethyl)-3H-diazirin-3-yl)phenoxy)methyl 3-(3-(trifluoromethyl)-3H-diazirin-3-yl)benzoate;

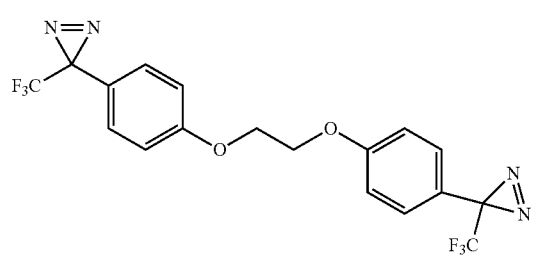 [SMILES: FC(F)(F)C1(c2ccc(OCCOc3ccc(C4(C(F)(F)F)N=N4)cc3)cc2)N=N1]

1,2-bis(4-(3-(trifluoromethyl)-3H-diazirin-3-yl)phenoxy)ethane;

1,3-bis((4-(3-(trifluoromethyl)-3H-diazirin-3-yl)benzyl)oxy)propane;

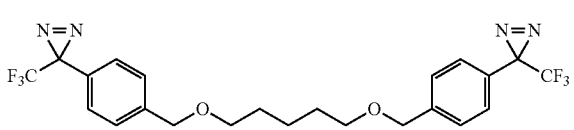 [SMILES: FC(F)(F)C1(c2ccc(COCCCCCOCc3ccc(C4(C(F)(F)F)N=N4)cc3)cc2)N=N1]

1,5-bis((4-(3-(trifluoromethyl)-3H-diazirin-3-yl)benzyl)oxy)pentane;

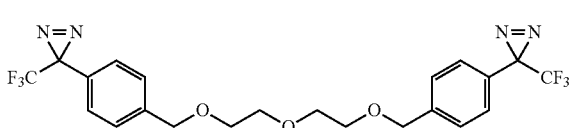

3,3'-(((((oxybis(ethane-2,1-diyl))bis(oxy))bis(methylene))bis(4,1-phenylene))bis(3-(trifluoromethyl)-3H-diazirine);

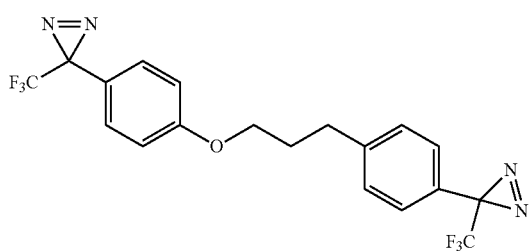

3-(trifluoromethyl)-3-(4-(3-(4-(3-(trifluoromethyl)-3H-diazirin-3-yl)phenoxy)propyl)phenyl)-3H-diazirine;

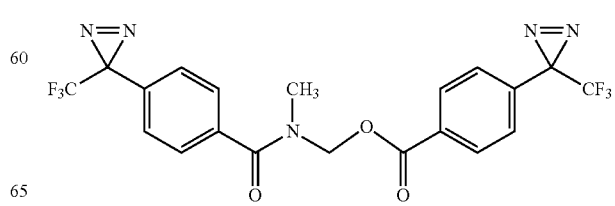

(N-methyl-4-(3-(trifluoromethyl)-3H-diazirin-3-yl)benzamido)methyl 4-(3-(trifluoromethyl)-3H-diazirin-3-yl)benzoate; and

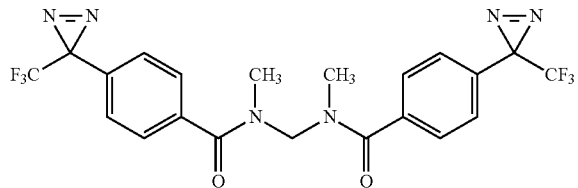 [SMILES: CN(CN(C)C(=O)c1ccc(C2(C(F)(F)F)N=N2)cc1)C(=O)c1ccc(C2(C(F)(F)F)N=N2)cc1]

N,N'-methylenebis(N-methyl-4-(3-(trifluoromethyl)-3H-diazirin-3-yl)benzamide).

6. The OE device according to claim 1, wherein the compound of formula (V) is selected from the group consisting of:

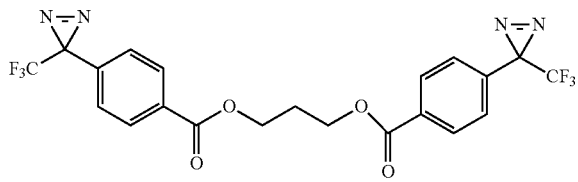 [SMILES: O=C(OCCCOC(=O)c1ccc(C2(C(F)(F)F)N=N2)cc1)c1ccc(C2(C(F)(F)F)N=N2)cc1]

propane-1,3-diyl bis(4-(3-(trifluoromethyl)-3H-diazirin-3-yl)benzoate);

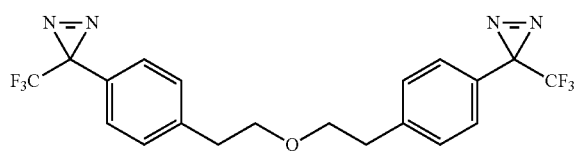 [SMILES: FC(F)(F)C1(c2ccc(CCOCCc3ccc(C4(C(F)(F)F)N=N4)cc3)cc2)N=N1]

3,3'-((oxybis(ethane-2,1-diyl))bis(4,1-phenylene))bis(3-(trifluoromethyl)-3H-diazirine); and

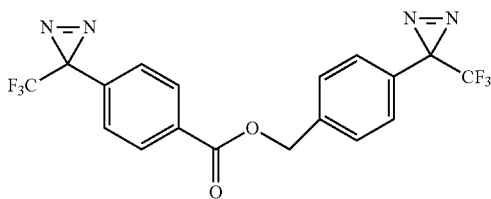 [SMILES: O=C(OCc1ccc(C2(C(F)(F)F)N=N2)cc1)c1ccc(C2(C(F)(F)F)N=N2)cc1]

4-(3-(trifluoromethyl)-3H-diazirin-3-yl)benzyl 4-(3-(trifluoromethyl)-3H-diazirin-3-yl)benzoate.

7. A dielectric layer in an OE device, said dielectric layer comprising a polycycloolefinic polymer as defined in claim 1.

8. A dielectric layer in an OE device, said dielectric layer comprising a compound of formula (V) as defined in claim 1.

9. A dielectric layer in an OE device, said dielectric layer comprising a compound of formula (V) as defined in claim 1, said compound of formula (V) is selected from the group consisting of:

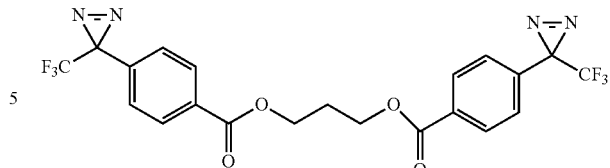

propane-1,3-diyl bis(4-(3-(trifluoromethyl)-3H-diazirin-3-yl)benzoate);

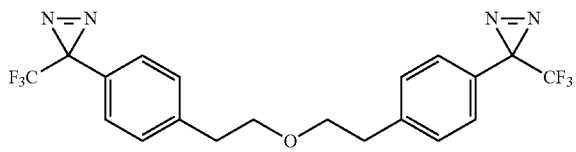 [SMILES: FC(F)(F)C1(c2ccc(CCOCCc3ccc(C4(C(F)(F)F)N=N4)cc3)cc2)N=N1]

3,3'-((oxybis(ethane-2,1-diyl))bis(4,1-phenylene))bis(3-(trifluoromethyl)-3H-diazirine); and

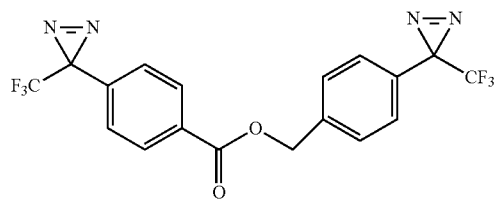 [SMILES: O=C(OCc1ccc(C2(C(F)(F)F)N=N2)cc1)c1ccc(C2(C(F)(F)F)N=N2)cc1]

4-(3-(trifluoromethyl)-3H-diazirin-3-yl)benzyl 4-(3-(trifluoromethyl)-3H-diazirin-3-yl)benzoate.

10. The OE device according to claim 1, which is an Organic Field Effect Transistor (OFET), Organic Thin Film Transistor (OTFT), Organic Light Emitting Diode (OLED) or Organic Photovoltaic (OPV) device or Organic Photodetector (OPD).

11. The OE device according to claim 10, which is a top gate Organic Field Effect Transistor (OFET) or bottom gate Organic Field Effect Transistor (OFET).

12. The top gate Organic Field Effect Transistor (OFET) according to claim 11, which comprises a substrate (1), source and drain electrodes (2a, 2b), an organic semiconductor (OSC) layer (3), a dielectric layer (4) comprising the polycycloolefinic polymer and serving as gate insulator and gate electrode (5).

13. A process for preparing an Organic Field Effect Transistor (OFET) according to claim 12, which comprises:
A) forming source and drain electrodes (2a, 2b) on a substrate (1),
B) forming an organic semiconductor (OSC) layer (3) by deposition of an organic semiconductor (OSC) material on the source and drain electrodes (2a, 2b),
C) forming a dielectric layer (4) by deposition of the polycycloolefinic polymer on the organic semiconductor (OSC) layer (3), and
D) forming a gate electrode (5) on the dielectric layer (4).

14. The bottom gate Organic Field Effect Transistor (OFET) according to claim 11, which comprises a substrate (1), a gate electrode (5), a dielectric layer (4) comprising the polycycloolefinic polymer and serving as gate insulator, source and drain electrodes (2a, 2b), an organic semiconductor (OSC) layer (3), and optionally a passivation layer (6).

15. A process for preparing an Organic Field Effect Transistor (OFET), which comprises:

A) forming a gate electrode (5) on a substrate (1),

B) forming a dielectric layer (4) by deposition of a polycycloolefinic polymer as defined in claim 1 on the substrate (1) and the gate electrode (5), C) forming source and drain electrodes (2a, 2b) on the dielectric layer (4), D) forming an organic semiconductor (OSC) layer (3) by deposition of an organic semiconductor (OSC) material on the source and drain electrodes (2a, 2b) and the dielectric layer (4), and E) optionally forming a passivation layer (6) on the organic semiconductor (OSC) layer (3).

16. The process according to claim 15, wherein the organic semiconductor (OSC) material of the organic semiconductor (OSC) layer (3) and the polycycloolefinic polymer of the dielectric layer (4) are deposited from an organic solution.

17. A product or assembly comprising an OE device according to claim 1, which is an Integrated Circuit (IC), a Radio Frequency Identification (RFID) tag, a security marking or security device containing an RFID tag, a Flat Panel Display (FPD), a backplane of an FPD, a backlight of an FPD, an electrophotographic device, an electrophotographic recording device, an organic memory device, a pressure sensor, an optical sensor, a chemical sensor, a biosensor or a biochip.

18. A composition comprising:

a) a polymer having one or more distinct repeat units of formula (IA), where the repeat units are derived from a monomer of formula (I):

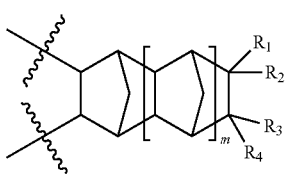

(IA)

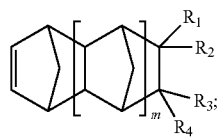

(I)

c) a random copolymer having repeat units of formula (IA) and another olefin, said random copolymer having the formula (II), where the repeat unit of formula (IA) is derived from a monomer of formula (I):

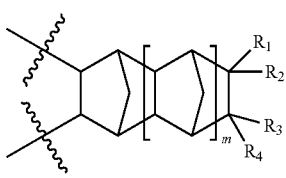

(IA)

-continued

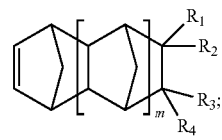

(I)

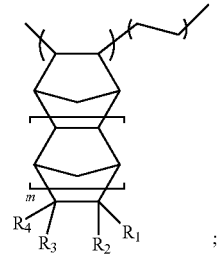

(II)

wherein
m is an integer 0, 1 or 2;
each occurrence of $R_1$, $R_2$, $R_3$ or $R_4$ may be same or different and each independently is hydrogen or a hydrocarbyl selected from the group consisting of linear or branched $(C_1-C_{12})$alkyl, $(C_3-C_{12})$cycloalkyl, $(C_3-C_{12})$cycloalkyl$(C_1-C_{12})$alkyl, $(C_6-C_{12})$bicycloalkyl, $(C_6-C_{12})$bicycloalkyl$(C_1-C_{12})$alkyl, $(C_7-C_{14})$tricycloalkyl, $(C_7-C_{14})$tricycloalkyl$(C_1-C_{12})$alkyl, $(C_6-C_{10})$aryl and $(C_6-C_{10})$aryl$(C_1-C_6)$alkyl; and
a compound of formula (V):

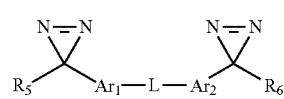

(V)

wherein,
L is a divalent linking or a spacer group selected from: —C(O)O—$R_7$—OC(O)—, —C(O)O—$R_7$—, —$R_7$—OC(O)—$R_7$—, —C(O)—$R_7$—OC(O)—, —C(O)—$R_7$—, —$R_7$—C(O)—$R_7$—, —O—$R_7$—OC(O)—, —O—$R_7$—O—, —O—$R_7$—, —$R_7$—O—$R_7$—, —C(O)NH—$(CH_2)_b$—NH(CO)—, where b is 1 to 15, —C(O)NH—$(CH_2CH_2O)_c(CH_2)_d$—$NR_5$(CO)—, where c is 2 to 6 and d is 1 to 6, and each occurrence of $R_7$ may be the same or different which is a divalent group independently selected from $(C_1-C_{12})$alkyl, $(C_3-C_{12})$cycloalkyl, $(C_6-C_{12})$aryl, $(C_6-C_{12})$aryl$(C_1-C_{12})$alkyl, $(C_6-C_{10})$heteroaryl, $(C_6-C_{10})$heteroaryl$(C_1-C_{12})$alkyl, —$(CH_2—CH_2—O)_a$—, where a is an integer from 1 to 10;
$R_5$ and $R_6$ are the same or different and each is independently selected from the group consisting of $(C_1-C_{12})$alkyl, where portions of hydrogen on alkyl are replaced with fluorine, $(C_1-C_{12})$perfluoroalkyl, $(C_6-C_{12})$aryl, $(C_6-C_{12})$aryl$(C_1-C_{12})$alkyl, where portions of hydrogen on alkyl are replaced with fluorine, and $(C_6-C_{12})$arylperfluoro$(C_1-C_{12})$alkyl; and
$Ar_1$ and $Ar_2$ same or different and each is independently selected from $(C_6-C_{12})$arylene or $(C_6-C_{12})$heteroarylene group optionally substituted with a group selected from halogen, —OH$(C_1-C_4)$alkyl, $(C_1-C_4)$alkoxy, $(C_6-C_{10})$aryl, $(C_6-C_{12})$aryloxy, $(C_6-C_{12})$aryl $(C_1-C_4)$alkyl and $(C_6-C_{12})$aryl$(C_1-C_4)$alkyloxy.

19. The composition according to claim 18 wherein said compound of formula (V) is selected from the group consisting of:

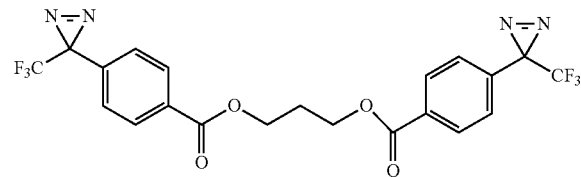 [SMILES: O=C(OCCCOC(=O)c1ccc(C2(C(F)(F)F)N=N2)cc1)c1ccc(C2(C(F)(F)F)N=N2)cc1]

propane-1,3-diyl bis(4-(3-(trifluoromethyl)-3H-diazirin-3-yl)benzoate);

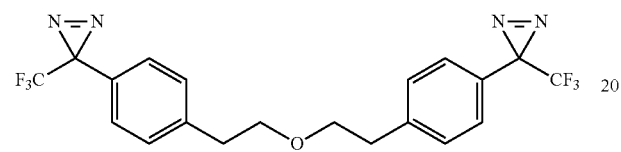

3,3'-((oxybis(ethane-2,1-diyl))bis(4,1-phenylene))bis(3-(trifluoromethyl)-3H-diazirine); and

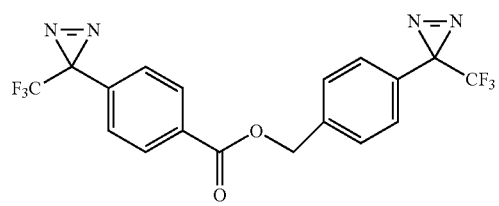 [SMILES: O=C(OCc1ccc(C2(C(F)(F)F)N=N2)cc1)c1ccc(C2(C(F)(F)F)N=N2)cc1]

4-(3-(trifluoromethyl)-3H-diazirin-3-yl)benzyl 4-(3-(trifluoromethyl)-3H-diazirin-3-yl)benzoate.

20. The composition according to claim 18 wherein said compound of formula (V) is selected from the group consisting of:

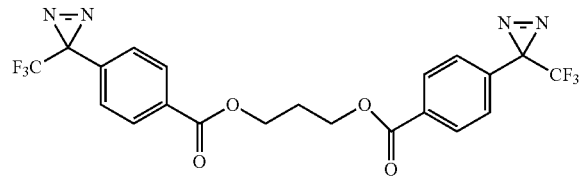 [SMILES: O=C(OCCCOC(=O)c1ccc(C2(C(F)(F)F)N=N2)cc1)c1ccc(C2(C(F)(F)F)N=N2)cc1]

propane-1,3-diyl bis(4-(3-(trifluoromethyl)-3H-diazirin-3-yl)benzoate); and

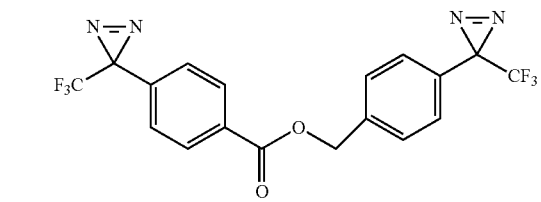 [SMILES: O=C(OCc1ccc(C2(C(F)(F)F)N=N2)cc1)c1ccc(C2(C(F)(F)F)N=N2)cc1]

4-(3-(trifluoromethyl)-3H-diazirin-3-yl)benzyl 4-(3-(trifluoromethyl)-3H-diazirin-3-yl)benzoate.

* * * * *